(12) United States Patent
Li

(10) Patent No.: US 12,324,339 B2
(45) Date of Patent: Jun. 3, 2025

(54) PIXEL ARRANGEMENT STRUCTURE AND DRIVING METHOD THEREFOR, AS WELL AS DISPLAY SUBSTRATE AND MANUFACTURING METHOD THEREFOR

(71) Applicant: BOE Technology Group Co., Ltd., Beijing (CN)

(72) Inventor: Guangru Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/574,297

(22) PCT Filed: Oct. 29, 2021

(86) PCT No.: PCT/CN2021/127423
§ 371 (c)(1),
(2) Date: Dec. 26, 2023

(87) PCT Pub. No.: WO2023/070524
PCT Pub. Date: May 4, 2023

(65) Prior Publication Data
US 2024/0244913 A1    Jul. 18, 2024

(51) Int. Cl.
*H10K 59/35*    (2023.01)
*H01L 25/16*    (2023.01)
(Continued)

(52) U.S. Cl.
CPC ......... *H10K 59/353* (2023.02); *H01L 25/167* (2013.01); *H10K 50/115* (2023.02); *H10K 59/1201* (2023.02); *H10K 59/90* (2023.02)

(58) Field of Classification Search
None
See application file for complete search history.

(56) References Cited

U.S. PATENT DOCUMENTS

| | | | | |
|---|---|---|---|---|
| 2012/0105517 A1* | 5/2012 | Yang | ..................... | G09G 3/003 345/694 |
| 2012/0147065 A1* | 6/2012 | Byun | ................... | G09G 3/3208 345/77 |

(Continued)

FOREIGN PATENT DOCUMENTS

| | | | | |
|---|---|---|---|---|
| CN | 108878493 A | * | 11/2018 | ......... H01L 27/3227 |
| CN | 109243365 A | | 1/2019 | |

(Continued)

OTHER PUBLICATIONS

CN-108878493-A translation (Year: 2018).*

(Continued)

*Primary Examiner* — Dorothy Harris
(74) *Attorney, Agent, or Firm* — IPro, PLLC

(57) ABSTRACT

A pixel arrangement structure and its driving method, as well as a display substrate and its manufacturing method are provided. The pixel arrangement structure comprises: pixel units arranged in an array, where each of the pixel units comprises a first sub-pixel (11) and a second sub-pixel (12), the first sub-pixel (11) includes a first quantum dot light emitting diode, the second sub-pixel (12) includes an inorganic light emitting diode, a light emitting color of the second sub-pixel is identical to that of the first sub-pixel, or the light emitting color of the second sub-pixel is white. The display substrate has a long service life and wide color gamut.

20 Claims, 19 Drawing Sheets

(51) Int. Cl.
*H10K 50/115* (2023.01)
*H10K 59/12* (2023.01)
*H10K 59/90* (2023.01)

(56) References Cited

U.S. PATENT DOCUMENTS

| | | | | |
|---|---|---|---|---|
| 2013/0070006 | A1* | 3/2013 | Yang | G09G 3/3225 |
| | | | | 345/694 |
| 2014/0151709 | A1 | 6/2014 | Nishiyama et al. | |
| 2015/0009194 | A1* | 1/2015 | Kim | G09G 3/3233 |
| | | | | 345/80 |
| 2016/0121073 | A1* | 5/2016 | Mok | G09G 3/2003 |
| | | | | 345/694 |
| 2016/0248029 | A1* | 8/2016 | Liu | H10K 59/35 |
| 2016/0351843 | A1* | 12/2016 | Yang | C09K 11/08 |
| 2018/0182977 | A1* | 6/2018 | Hirose | H10K 50/115 |
| 2018/0190625 | A1* | 7/2018 | Steckel | H01L 33/60 |
| 2018/0366672 | A1* | 12/2018 | Wang | H10K 71/12 |
| 2019/0018287 | A1* | 1/2019 | Lüchinger | G02F 1/133617 |
| 2019/0096960 | A1* | 3/2019 | Lee | H10K 50/805 |
| 2020/0098301 | A1* | 3/2020 | Bao | H10K 59/351 |
| 2020/0119101 | A1* | 4/2020 | Lee | H10K 59/878 |
| 2020/0135811 | A1* | 4/2020 | Jung | H10K 71/50 |
| 2020/0312922 | A1* | 10/2020 | Hack | H10K 59/351 |
| 2020/0327843 | A1* | 10/2020 | Ahmed | G09G 3/2003 |
| 2020/0343467 | A1 | 10/2020 | Li | |
| 2024/0013710 | A1* | 1/2024 | Hou | H10K 59/351 |
| 2024/0016018 | A1* | 1/2024 | Hou | H10K 85/115 |

FOREIGN PATENT DOCUMENTS

| | | | | |
|---|---|---|---|---|
| CN | 109346506 | A | | 2/2019 |
| CN | 111261662 | A | | 6/2020 |
| CN | 111490070 | A | | 8/2020 |
| CN | 111584584 | A | | 8/2020 |
| CN | 112038383 | A | | 12/2020 |
| CN | 111490070 | B | * 2/2023 ......... H01L 27/3216 |
| JP | 2010020154 | A | | 1/2010 |

OTHER PUBLICATIONS

CN-111490070-B translation (Year: 2023).*
PCT/CN2021/127423 international search report.
PCT/CN2021/127423 Written Opinion.

* cited by examiner

| Form a driving circuit layer on a base, where the driving circuit layer includes a first pixel circuit, a second pixel circuit, a third pixel circuit, and a fourth pixel circuit, the first pixel circuit is configured to drive the first sub-pixel to emit light, the second pixel circuit is configured to drive the second sub-pixel to emit light, the third pixel circuit is configured to drive the third sub-pixel to emit light, the fourth pixel circuit is configured to drive the fourth sub-pixel to emit light, the driving circuit layer includes exposed first electrodes, the first pixel circuit is connected to a corresponding first electrode, the third pixel circuit is connected to a corresponding first electrode, and the fourth pixel circuit is connected to a corresponding first electrode | 3301 |

↓

| Manufacture a first quantum dot light emitting layer, a second quantum dot light emitting layer, and a third quantum dot light emitting layer through photoetching, where the first quantum dot light emitting layer is located on the first electrode connected to the first pixel circuit, the second quantum dot light emitting layer is located on the first electrode connected to the third pixel circuit, and the third quantum dot light emitting layer is located on the first electrode connected to the fourth pixel circuit | 3302 |

↓

| Manufacture second electrodes, where the second electrodes are located at a side of the first quantum dot light emitting layer away from the first electrode, a side of the second quantum dot light emitting layer away from the first electrode, and a side of the third quantum dot light emitting layer away from the first electrode, the first quantum dot light emitting layer with the first electrode and the second electrode located at both sides of the first quantum dot light emitting layer form the first sub-pixel, the second quantum dot light emitting layer with the first electrode and the second electrode located at both sides of the second quantum dot light emitting layer form the third sub-pixel, and the third quantum dot light emitting layer with the first electrode and the second electrode located at both sides of the third quantum dot light emitting layer form the fourth sub-pixel | 3303 |

↓

| Place the manufactured second sub-pixel on the driving circuit layer through transfer printing, and the second sub-pixel is electrically connected to the second pixel circuit | 3304 |

FIG. 33

PIXEL ARRANGEMENT STRUCTURE AND DRIVING METHOD THEREFOR, AS WELL AS DISPLAY SUBSTRATE AND MANUFACTURING METHOD THEREFOR

CROSS-REFERENCE TO RELATED APPLICATIONS

This application is a national stage of international PCT Application No. PCT/CN2021/127423 filed on Oct. 29, 2021, the entire contents of which are incorporated herein by reference.

TECHNICAL FIELD

The present disclosure relates to the field of display technology, and in particular, to a pixel arrangement structure and its driving method, as well as a display substrate and its manufacturing method.

BACKGROUND

In the related art, quantum dot light emitting diodes (QLED) have advantages of wide color gamut, printability, high luminous efficiency, etc., and thereby, may be applied to display substrates. However, since there are easily detached ligands on surfaces of quantum dots of QLEDs, and an organic compound with poor electrical stability is used in a hole transport layer of QLEDs, a service life of QLEDs is shorter, which results in a shorter service life of display substrates based on QLEDs.

SUMMARY

The present disclosure provides a pixel arrangement structure and its driving method, as well as a display substrate and its manufacturing method.

According to a first aspect of embodiments of the present disclosure, there is provided a pixel arrangement structure, including: pixel units arranged in an array, where each of the pixel units includes a first sub-pixel and a second sub-pixel, the first sub-pixel includes a first quantum dot light emitting diode, the second sub-pixel includes an inorganic light emitting diode, a light emitting color of the second sub-pixel is identical to that of the first sub-pixel, or the light emitting color of the second sub-pixel is white.

In an embodiment, the pixel arrangement structure includes: two second sub-pixels, where a light emitting color of one of the two second sub-pixels is identical to that of the first sub-pixel, and a light emitting color of the other one of the two second sub-pixels is white.

In an embodiment, the light emitting color of the first sub-pixel is blue.

In an embodiment, the second sub-pixel is a Micro LED or Mini LED.

In an embodiment, a size of the second sub-pixel is smaller than or equal to that of the first sub-pixel.

In an embodiment, each of the pixel units further includes a third sub-pixel and a fourth sub-pixel;
the third sub-pixel includes a second quantum dot light emitting diode, and a light emitting color of the third sub-pixel is red;
the fourth sub-pixel includes a third quantum dot light emitting diode, and a light emitting color of the fourth sub-pixel is green.

According to a second aspect of the embodiments of the present disclosure, there is provided a method of driving a pixel arrangement structure, where the method is used to drive the pixel arrangement structure as described above, and includes:
for each of pixel units, determining color coordinates of a light emitting color of the pixel unit according to image data of a to-be-displayed image;
in response to that the color coordinates are located within a first color gamut corresponding to a second sub-pixel, controlling the second sub-pixel to emit light, and prohibiting the first sub-pixel from emitting light; in response to that the color coordinates are located outside the first color gamut and within a second color gamut corresponding to the first sub-pixel, controlling the first sub-pixel to emit light.

According to a third aspect of the embodiments of the present disclosure, there is provided a display substrate, including: the pixel arrangement structure as described above.

According to a fourth aspect of the embodiments of the present disclosure, there is provided a method of manufacturing a display substrate, where the method is used to manufacture the display substrate as described above, and includes:
forming a driving circuit layer on a base, where the driving circuit layer includes a first pixel circuit and a second pixel circuit, the first pixel circuit is configured to drive the first sub-pixel to emit light, and the second pixel circuit is configured to drive the second sub-pixel to emit light;
forming a light emitting layer, where the light emitting layer includes the first sub-pixel and the second sub-pixel, the first sub-pixel is electrically connected to the first pixel circuit, and the second sub-pixel is electrically connected to the second pixel circuit.

In an embodiment, forming the light emitting layer includes:
manufacturing the second sub-pixel;
placing the second sub-pixel on the driving circuit layer through transfer printing, and electrically connecting the second sub-pixel to the second pixel circuit;
forming a pixel defining layer, where the pixel defining layer is located at a side of the driving circuit layer away from the base, the pixel defining layer includes a pixel defining layer opening, the first pixel circuit includes a first electrode, and a projection of a contact surface between the first electrode and the pixel defining layer opening on the base is located within a projection of the first electrode on the base;
manufacturing a quantum dot light emitting layer in the pixel defining layer opening through printing;
manufacturing a second electrode, where the second electrode is located at a side of the quantum dot light emitting layer away from the first electrode, and the first electrode, the quantum dot light emitting layer, and the second electrode form the first sub-pixel.

In an embodiment, forming the light emitting layer includes:
forming a pixel defining layer, where the pixel defining layer is located at a side of the driving circuit layer away from the base, the pixel defining layer includes a pixel defining layer opening and through holes, the first pixel circuit includes a first electrode, a projection of a contact surface between the first electrode and the pixel defining layer opening on the base is located within a projection of the first electrode on the base, and projections of the through holes on the base are located within a projection of the second pixel circuit on the base;

manufacturing conductive components, where the conductive components are located in the through holes, a first end of each of the conductive components is exposed from the pixel defining layer, and a second end of each of the conductive components is electrically connected to the second pixel circuit;

manufacturing a quantum dot light emitting layer in the pixel defining layer opening through printing;

manufacturing a second electrode, where the second electrode is located at a side of the quantum dot light emitting layer away from the first electrode, and the first electrode, the quantum dot light emitting layer, and the second electrode form the first sub-pixel;

placing a manufactured second sub-pixel on the conductive components through transfer printing, and electrically connecting the second sub-pixel to the conductive components.

In an embodiment, forming the light emitting layer includes:

forming a pixel defining layer, where the pixel defining layer is located at a side of the driving circuit layer away from the base, the pixel defining layer includes a pixel defining layer opening and through holes, the first pixel circuit includes a first electrode, a projection of a contact surface between the first electrode and the pixel defining layer opening on the base is located within a projection of the first electrode on the base, and projections of the through holes on the base are located within a projection of the second pixel circuit on the base;

manufacturing conductive components, where the conductive components are located in the through holes, a first end of each of the conductive components is exposed from the pixel defining layer, and a second end of each of the conductive components is electrically connected to the second pixel circuit;

placing a manufactured second sub-pixel on the conductive components through transfer printing, and electrically connecting the second sub-pixel to the conductive components;

manufacturing a quantum dot light emitting layer in the pixel defining layer opening through printing;

manufacturing a second electrode, where the second electrode is located at a side of the quantum dot light emitting layer away from the first electrode, and the first electrode, the quantum dot light emitting layer, and the second electrode form the first sub-pixel.

In an embodiment, forming the light emitting layer includes:

manufacturing the second sub-pixel;

placing the second sub-pixel on the driving circuit layer through transfer printing, and electrically connecting the second sub-pixel to the second pixel circuit;

manufacturing a quantum dot light emitting layer through photoetching, where the driving circuit layer includes an exposed first electrode, the first electrode is connected to the first pixel circuit, and the quantum dot light emitting layer is located on the first electrode;

manufacturing a second electrode, where the second electrode is located at a side of the quantum dot light emitting layer away from the first electrode, and the first electrode, the quantum dot light emitting layer, and the second electrode form the first sub-pixel.

In an embodiment, forming the light emitting layer includes:

manufacturing a quantum dot light emitting layer through photoetching, where the driving circuit layer includes an exposed first electrode, the first electrode is connected to the first pixel circuit, and the quantum dot light emitting layer is located on the first electrode;

manufacturing a second electrode, where the second electrode is located at a side of the quantum dot light emitting layer away from the first electrode, and the first electrode, the quantum dot light emitting layer, and the second electrode form the first sub-pixel;

placing a manufactured second sub-pixel on the driving circuit layer through transfer printing, and electrically connecting the second sub-pixel to the second pixel circuit.

BRIEF DESCRIPTION OF THE DRAWINGS

FIG. 33 is a flowchart illustrating another method for manufacturing a display substrate according to an embodiment of the present disclosure.

DETAILED DESCRIPTION OF THE EMBODIMENTS

In order to make the purposes, features and advantages of the present disclosure more apparent and easier to understand, specific embodiments of the disclosure will be explained in detail below in conjunction with the accompanying drawings.

An embodiment of the present disclosure provides a pixel arrangement structure.

Figure 1:
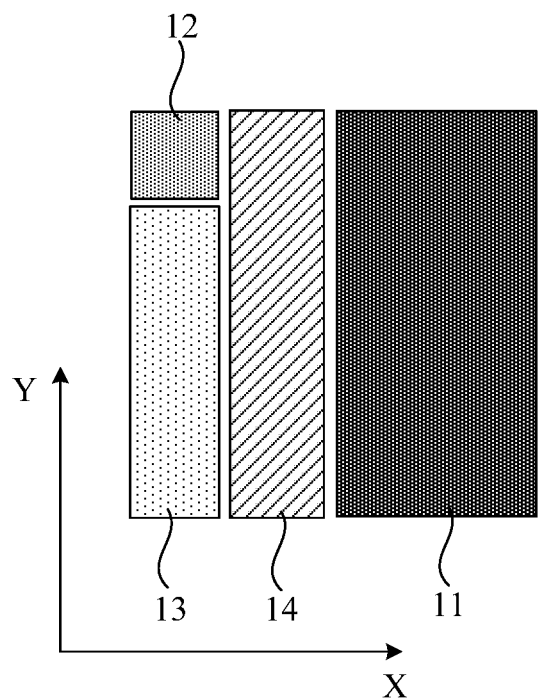
FIG. 1 is a structural schematic diagram illustrating a pixel arrangement structure according to an embodiment of the present disclosure.

The pixel arrangement structure includes pixel units arranged in an array. As shown in FIG. 1, each pixel unit includes a first sub-pixel 11 and a second sub-pixel 12. The first sub-pixel 11 includes a first quantum dot light emitting diode (not shown), and the second sub-pixel 12 includes an inorganic light emitting diode. A light emitting color of the second sub-pixel 12 is the same as that of the first sub-pixel 11, or the light emitting color of the second sub-pixel 12 is white.

In this embodiment, each pixel unit in the pixel arrangement structure includes the first sub-pixel and the second sub-pixel, where the first sub-pixel includes the first quantum dot light emitting diode, the second sub-pixel includes the inorganic light emitting diode, and the light emitting color of the second sub-pixel is the same as that of the first sub-pixel, or the light emitting color of the second sub-pixel is white. A color gamut of a light emitting color of the pixel unit when the first sub-pixel emits light is wider than that when the second sub-pixel emits light, the second sub-pixel is more stable than the first sub-pixel, and a service life of the second sub-pixel is longer than that of the first sub-pixel. Therefore, color coordinates of a light emitting color of each pixel unit can be determined according to image data of a to-be-displayed image. When the color coordinates of the light emitting color of the pixel unit are located within a first color gamut corresponding to the second sub-pixel, the second sub-pixel is controlled to emit light, and the first sub-pixel is prohibited from emitting light. When the color coordinates of the light emitting color of the pixel unit are located outside the first color gamut and within a second color gamut corresponding to the first sub-pixel, the first sub-pixel is controlled to emit light. In this way, when the pixel arrangement structure is applied to a display substrate, a cumulative duration for the first sub-pixel to emit light can be reduced, which is beneficial to extend the service life of the first sub-pixel and further beneficial to extend a service life of the display substrate, making the display substrate have advantages of both wide color gamut and long service life.

The pixel arrangement structure provided in the embodiments of the present disclosure has been introduced in brief above, and will be described in detail below.

An embodiment of the present disclosure provides a pixel arrangement structure. The pixel arrangement structure includes pixel units arranged in an array. As shown in FIG. 1, each pixel unit includes: a first sub-pixel 11, a second sub-pixel 12, a third sub-pixel 13, and a fourth sub-pixel 14.

In this embodiment, each pixel unit includes one first sub-pixel 11. The first sub-pixel 11 includes a first quantum dot light emitting diode, and a light emitting color of the first sub-pixel 11 is blue. The first quantum dot light emitting diode includes a first electrode, a first quantum dot light emitting layer, and a second electrode. The first quantum dot light emitting layer is located between the first electrode and the second electrode. The first electrode may be an anode, and the second electrode may be a cathode, which is not limited here. When the first quantum dot light emitting diode is working, the first quantum dot light emitting layer may emit blue light.

In this embodiment, each pixel unit includes one third sub-pixel 13. The third sub-pixel 13 includes a second quantum dot light emitting diode, and a light emitting color of the third sub-pixel is red. A structure of the second quantum dot light emitting diode is similar to that of the first quantum dot light emitting diode. The second quantum dot light emitting diode may include a first electrode, a second quantum dot light emitting layer, and a second electrode. When the second quantum dot light emitting diode is working, the second quantum dot light emitting layer may emit red light.

In this embodiment, each pixel unit includes one fourth sub-pixel 14. The fourth sub-pixel 14 includes a third quantum dot light emitting diode, and a light emitting color of the fourth sub-pixel 14 is green. A structure of the third quantum dot light emitting diode is similar to that of the first quantum dot light emitting diode. The third quantum dot light emitting diode may include a first electrode, a third quantum dot light emitting layer, and a second electrode. When the third quantum dot light emitting diode is working, the third quantum dot light emitting layer may emit green light.

In this embodiment, each pixel unit includes one second sub-pixel 12. A light emitting color of the second sub-pixel 12 is the same as that of the first sub-pixel 11. The light emitting color of the second sub-pixel 12 is blue. The second sub-pixel 12 includes an inorganic light emitting diode. The inorganic light emitting diode includes a third electrode, an inorganic light emitting layer, and a fourth electrode. The inorganic light emitting layer is located between the third electrode and the fourth electrode. The third electrode may be an anode, and the fourth electrode may be a cathode. When the inorganic light emitting diode is working, the inorganic light emitting layer may emit blue light.

In other embodiments, each pixel unit may include one second sub-pixel 12, and a light emitting color of the second sub-pixel 12 may be white. In other embodiments, each pixel unit may include two second sub-pixels 12. A light emitting color of one second sub-pixel 12 is blue, and a light emitting color of the other second sub-pixel 12 is white.

In this embodiment, the second sub-pixel 12 is a Micro LED. In other embodiments, the second sub-pixel 12 may be a Mini LED.

In this embodiment, a color gamut of light emitted from the first sub-pixel 11 is wider than that emitted from the second sub-pixel 12. A service life of the second sub-pixel 12 is longer than that of the first sub-pixel 11. Therefore, only when the first sub-pixel 11 emits light to make color coordinates of a light emitting color of the pixel unit reach color coordinates of a to-be-displayed image, the first sub-pixel 11 is controlled to emit light. When the second sub-pixel 12 emits light to make the color coordinates of the light emitting color of the pixel unit reach the color coordinates of the to-be-displayed image, the first sub-pixel 11 is prohibited from emitting light, and only the second sub-pixel 12 is controlled to emit light. In this way, when the pixel arrangement structure is applied to a display substrate, a cumulative duration for the first sub-pixel 11 to emit light can be reduced, which is beneficial to extend the service life of the first sub-pixel 11 and further beneficial to extend a service life of the display substrate, making the display substrate have advantages of both wide color gamut and long service life.

In this embodiment, as shown in FIG. 1, a size of the second sub-pixel 12 is smaller than that of the first sub-pixel 11. For example, in a first direction X, the size of the second sub-pixel 12 is smaller than that of the first sub-pixel 11, and in a second direction Y, the size of the second sub-pixel 12 is smaller than that of the first sub-pixel 11. In other embodiments, in the first direction X or in the second direction Y, the size of the second sub-pixel 12 is smaller than that of the first sub-pixel 11.

In this embodiment, as shown in FIG. 1, the third sub-pixel 13, the fourth sub-pixel 14, and the first sub-pixel 11 are arranged in a row in the first direction X, and the second sub-pixel 12 and the third sub-pixel 13 are arranged in a column in the second direction Y In the second direction Y, a total length of the second sub-pixel 12 and the third sub-pixel 13 may be slightly shorter than a length of the first sub-pixel 11. In the second direction Y, there is a gap between the second sub-pixel 12 and the third sub-pixel 13. In the second direction Y, a length of the second sub-pixel 12 is shorter than that of the third sub-pixel 13. That is, space may be made for the second sub-pixel 12 by reducing the length of the third sub-pixel 13. In this way, the influence of the second sub-pixel on a display resolution can be avoided.

In this embodiment, the length of the second sub-pixel 12 in the first direction X or in the second direction Y is shorter than 10 microns, or the length of the second sub-pixel 12 in the first direction X and in the second direction Y is shorter than 10 microns.

In this embodiment, as shown in FIG. 1, an area of the first sub-pixel 11 is greater than that of the fourth sub-pixel 14, and the area of the fourth sub-pixel 14 is greater than that of the third sub-pixel 13. The area of the third sub-pixel 13 is greater than that of the second sub-pixel 12.

Figure 2:
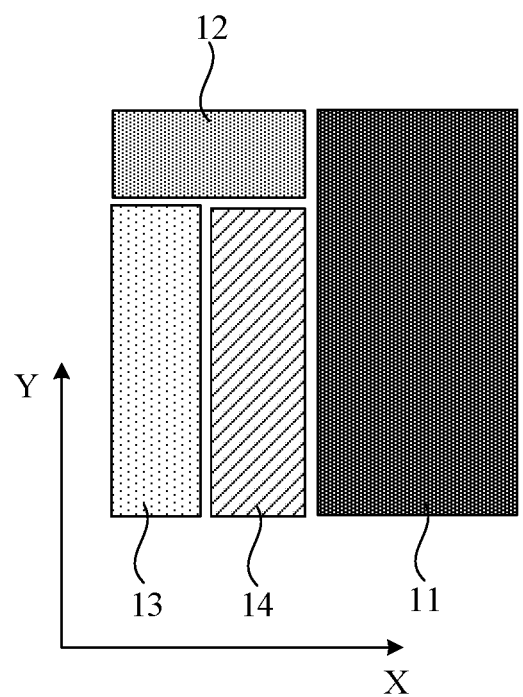
FIG. 2 is a structural schematic diagram illustrating another pixel arrangement structure according to an embodiment of the present disclosure.

In other embodiments, as shown in FIG. 2, the third sub-pixel 13, the fourth sub-pixel 14, and the first sub-pixel 11 are arranged in a row in the first direction X. In the second direction Y, the second sub-pixel 12 and the third sub-pixel 13 are arranged in a column, and the second sub-pixel 12 and the fourth sub-pixel 14 are arranged in a column. In the second direction Y, the length of the third sub-pixel 13 is substantially the same as that of the fourth sub-pixel 14, and is shorter than that of the first sub-pixel 11. In the second direction Y, the total length of the second sub-pixel 12 and the third sub-pixel 13 may be slightly shorter than that of the first sub-pixel 11. That is, space may be made for the second sub-pixel 12 by reducing the length of the third sub-pixel 13 and the length of the fourth sub-pixel 14. In this way, the influence of the second sub-pixel on a display resolution can be avoided.

Figure 3:
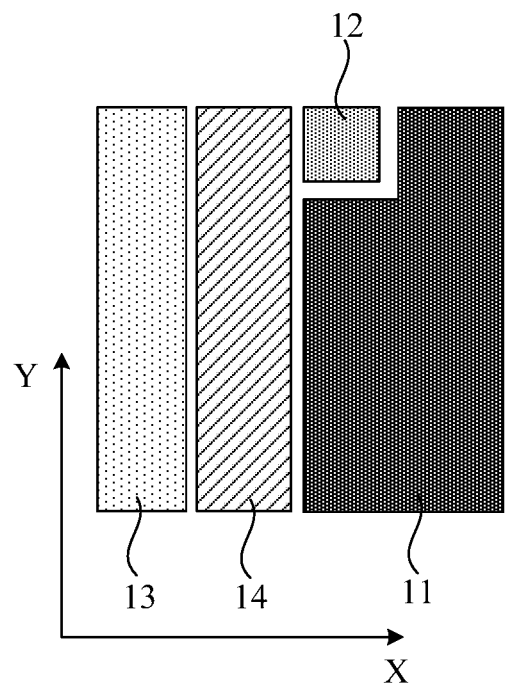
FIG. 3 is a structural schematic diagram illustrating another pixel arrangement structure according to an embodiment of the present disclosure.

In other embodiments, as shown in FIG. 3, the third sub-pixel 13, the fourth sub-pixel 14, and the first sub-pixel 11 are arranged in a row in the first direction X, and a shape of the second sub-pixel 12 is complementary to that of the first sub-pixel 11. That is, space may be made for the second sub-pixel 12 by reducing the area of the first sub-pixel 11. In this way, the influence of the second sub-pixel on a display resolution can be avoided.

Figure 4:
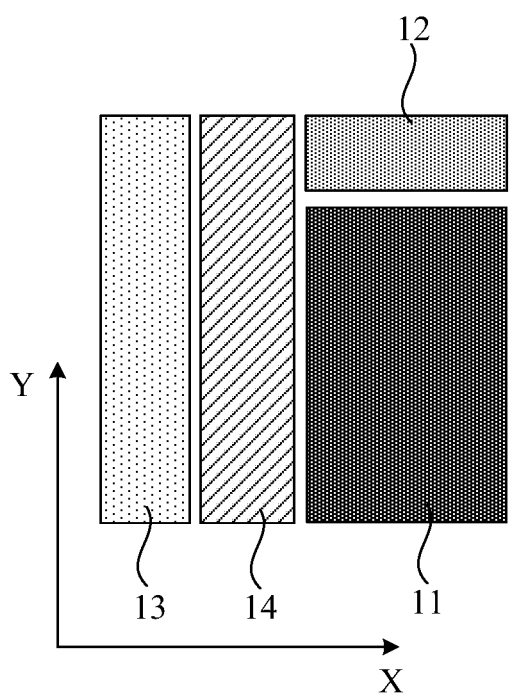
FIG. 4 is a structural schematic diagram illustrating another pixel arrangement structure according to an embodiment of the present disclosure.

In other embodiments, as shown in FIG. 4, the third sub-pixel 13, the fourth sub-pixel 14, and the first sub-pixel 11 are arranged in a row in the first direction X, and in the second direction Y, the second sub-pixel 12 and the first sub-pixel 11 are arranged in a column. In the first direction X, a length of the second sub-pixel 12 is the same as that of the first sub-pixel 11, and in the second direction Y, the length of the second sub-pixel 12 is shorter than that of the first sub-pixel 11. That is, space may be made for the second sub-pixel 12 by reducing the length of the first sub-pixel 11 in the second direction Y In this way, the influence of the second sub-pixel on a display resolution can be avoided.

Figure 5:
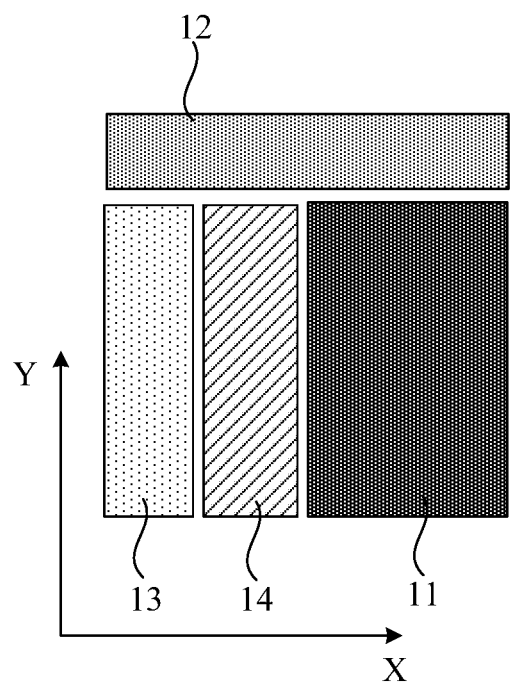
FIG. 5 is a structural schematic diagram illustrating another pixel arrangement structure according to an embodiment of the present disclosure.

In other embodiments, as shown in FIG. 5, the third sub-pixel 13, the fourth sub-pixel 14, and the first sub-pixel 11 are arranged in a row in the first direction X. In the second direction Y, the second sub-pixel 12 and the third sub-pixel 13 are arranged in a column, the second sub-pixel 12 and the fourth sub-pixel 14 are arranged in a column, and the second sub-pixel 12 and the first sub-pixel 11 are arranged in a column. That is, space may be made for the second sub-pixel 12 by reducing the length of the third sub-pixel 13, the length of the fourth sub-pixel 14, and the length of the first sub-pixel 11 in the second direction Y In this way, the influence of the second sub-pixel on a display resolution can be avoided.

Figure 6:
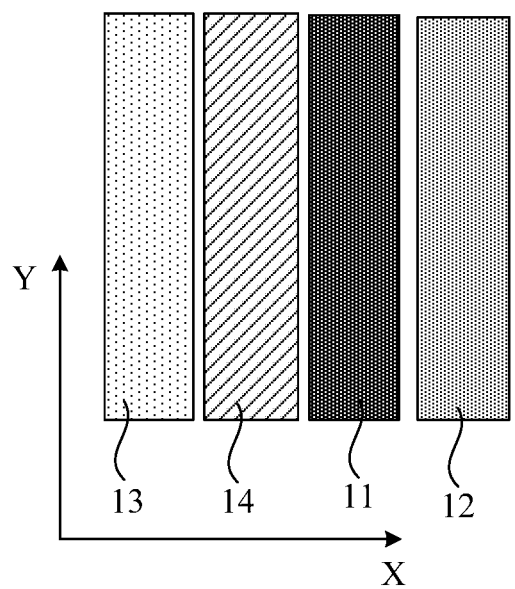
FIG. 6 is a structural schematic diagram illustrating another pixel arrangement structure according to an embodiment of the present disclosure.

In other embodiments, as shown in FIG. 6, the third sub-pixel 13, the fourth sub-pixel 14, the first sub-pixel 11, and the second sub-pixel 12 are arranged in a row in the first direction X, and the first sub-pixel 11 is adjacent to the second sub-pixel 12. In the first direction X, the length of the third sub-pixel 13, the length of the fourth sub-pixel 14, the length of the first sub-pixel 11, and the length of the second sub-pixel 12 may be substantially same. In the second direction Y, the length of the third sub-pixel 13, the length of the fourth sub-pixel 14, the length of the first sub-pixel 11, and the length of the second sub-pixel 12 may be substantially same. That is, space may be made for the second sub-pixel 12 by reducing the length of the first sub-pixel 11 in the first direction X. In this way, the influence of the second sub-pixel on a display resolution can be avoided.

Figure 7:
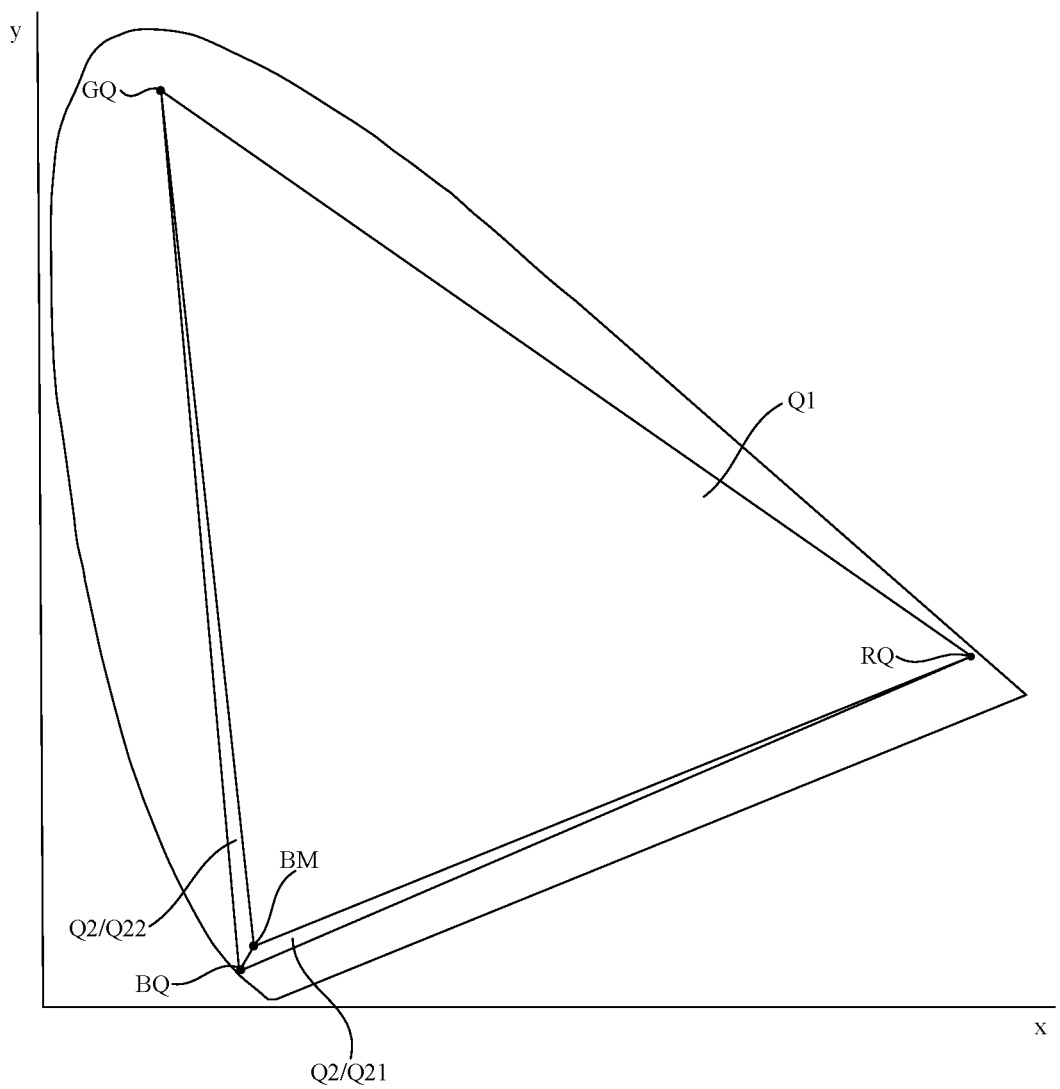
FIG. 7 is a chromaticity diagram according to an embodiment of the present disclosure.

In this embodiment, a chromaticity diagram of the pixel unit is shown in FIG. 7. In FIG. 7, RQ represents color coordinates of the light emitting color of the third sub-pixel 13, GQ represents color coordinates of the light emitting color of the fourth sub-pixel 14, BQ represents color coordinates of the light emitting color of the first sub-pixel 11, and BM represents color coordinates of the light emitting color of the second sub-pixel 12. As can be known from FIG. 7, a color gamut of the light emitting color of the pixel unit when the first sub-pixel 11, the third sub-pixel 13, and the fourth sub-pixel 14 emit light simultaneously is wider than that when the second sub-pixel 12, the third sub-pixel 13, and the fourth sub-pixel 14 emit light simultaneously.

For the convenience of description, the color gamut of the light emitting color of the pixel unit when the second sub-pixel 12, the third sub-pixel 13, and the fourth sub-pixel 14 emit light simultaneously is called a first color gamut Q1, and a color gamut from the color gamut of the light emitting color of the pixel unit when the first sub-pixel 11, the third sub-pixel 13, and the fourth sub-pixel 14 emit light simultaneously that exceeds the first color gamut Q1 is called a second color gamut Q2. As shown in FIG. 7, the second color gamut Q2 includes a first sub-color gamut Q21 and a second sub-color gamut Q22. When only the third sub-pixel 13 and the first sub-pixel 11 in the pixel unit emit light, the color coordinates of the light emitting color of the pixel unit are located in the first sub-color gamut Q21. When only the fourth sub-pixel 14 and the first sub-pixel 11 in the pixel unit emit light, the color coordinates of the light emitting color of the pixel unit are located in the second sub-color gamut Q22.

For each pixel unit, when the color coordinates of the light emitting color of the pixel unit is determined to be located in the first color gamut Q1 in the chromaticity diagram according to image data of the to-be-displayed image, the first sub-pixel 11 may be prohibited from emitting light, and the second sub-pixel 12 may be controlled to emit light. When the color coordinates of the light emitting color of the pixel unit are located outside the first color gamut Q1 and within the second color gamut Q2, the first sub-pixel 11 may be controlled to emit light.

In this embodiment, in the chromaticity diagram shown in FIG. 7, a sum of an area of the first color gamut Q1 and an area of the second color gamut Q2 is denoted as Sum, and a ratio of the area of the second color gamut Q2 to Sum is approximately 9%. That is, a probability of the first sub-pixel 11 being lighted is approximately 9%. Therefore, a cumulative duration for the first sub-pixel 11 to emit light is greatly reduced, which is beneficial to extend the service life of the first sub-pixel 11.

Figure 8:
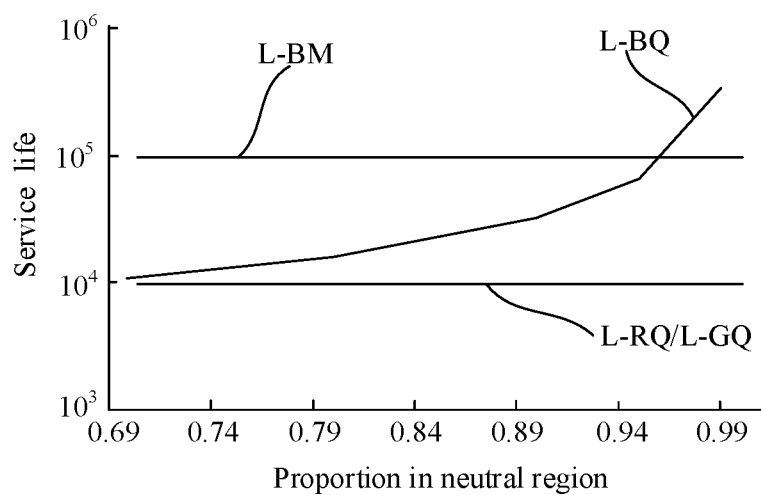
FIG. 8 is a schematic diagram illustrating a service life according to an embodiment of the present disclosure.

Through experiments, when the pixel arrangement structure is applied to the display substrate, service lives of the first sub-pixel 11, the second sub-pixel 12, the third sub-pixel 13, and the fourth sub-pixel 14 under the condition of T95@1000 nits are shown in FIG. 8. The meaning of T95@1000 nits is that in a case that initial brightness of a sub-pixel is 1000 nits, when the brightness of the sub-pixel decreases to 950 nits, a cumulative duration for the sub-pixel to emit light is a service life of the sub-pixel. In FIG. 8, a horizontal axis represents proportions of color coordinates of light emitting colors of all pixel units on the display substrate in a neutral region of the chromaticity diagram shown in FIG. 7. It is assumed that the remaining proportions are equally distributed to the first color gamut Q1 and the second color gamut Q2 shown in FIG. 7. It is assumed that brightness of respective colors (red, green, and blue) displayed in the first color gamut Q1, the first sub-color gamut Q21, and the second sub-color gamut Q22 is same. The neutral region is a region within a designated range of white light points and their surroundings. A vertical axis represents service lives, with hour as unit.

In FIG. 8, a curve L-RQ is a service life curve of the third sub-pixel 13, a curve L-GQ is a service life curve of the fourth sub-pixel 14, a curve L-BQ is a service life curve of the first sub-pixel 11, and a curve L-BM is a service life curve of the second sub-pixel 12. As shown in FIG. 8, the service life of the display substrate is no longer limited to the first sub-pixel 11 emitting blue light, but to the third sub-pixel 13 emitting red light and the fourth sub-pixel 14 emitting green light. Since the service lives of the third sub-pixel 13 emitting red light and the fourth sub-pixel 14 emitting green light are longer, the service life of the display substrate is extended.

An embodiment of the present disclosure provides a pixel arrangement structure. Similar to the above embodiments, in this embodiment, each pixel unit may include one first sub-pixel 11, one second sub-pixel 12, one third sub-pixel 13, and one fourth sub-pixel 14. Different from the above embodiments, in this embodiment, the light emitting color of the second sub-pixel 12 is white. A position of the second sub-pixel 12 in the pixel unit is the same as that in the pixel unit shown in FIGS. 1 to 6.

Figure 9:
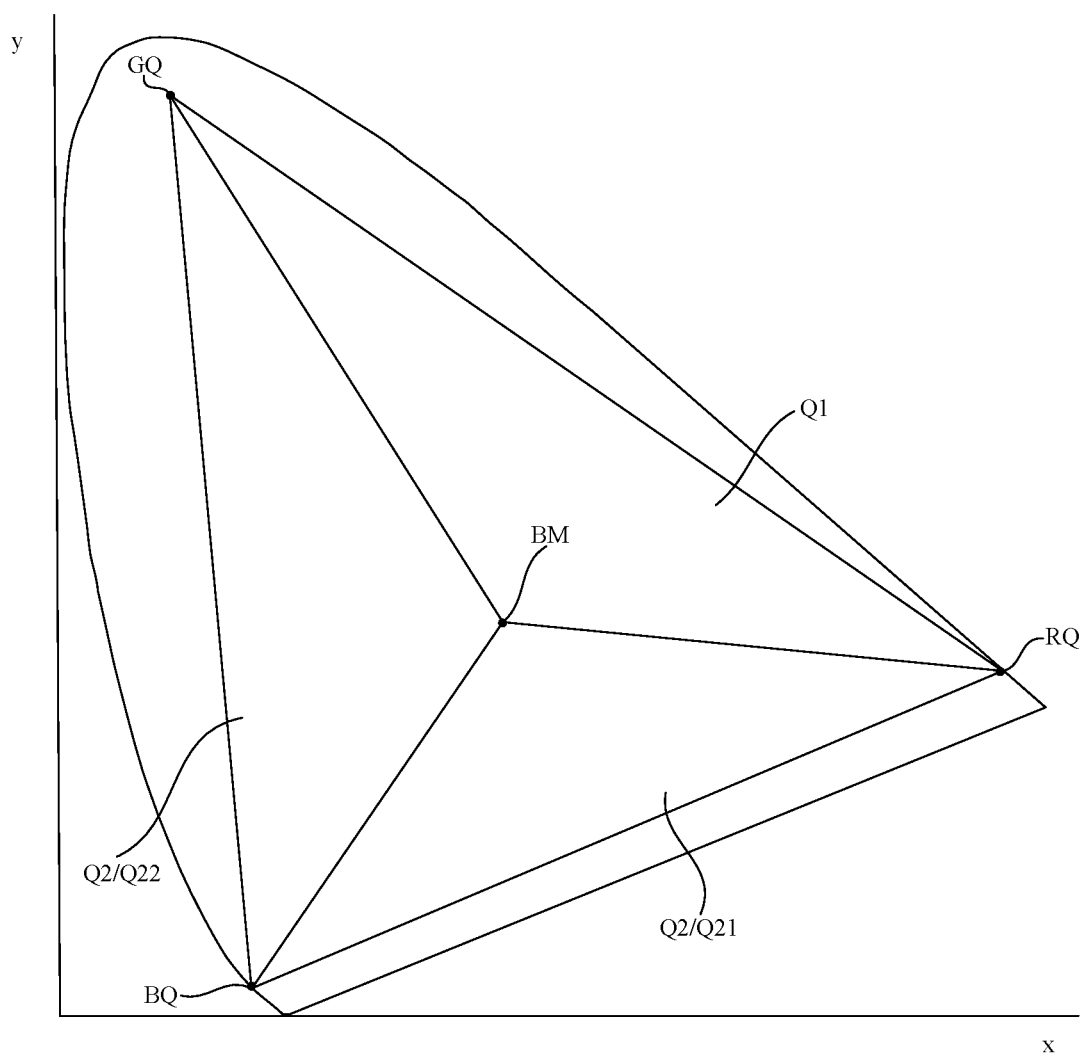
FIG. 9 is another chromaticity diagram according to an embodiment of the present disclosure.

In this embodiment, the chromaticity diagram of the pixel unit is shown in FIG. 9. The ratio of the area of the second color gamut Q2 to Sum is 54%. That is, the probability of the first sub-pixel 11 being lighted is approximately 54%. Therefore, a cumulative duration for the first sub-pixel 11 to emit light can be reduced, which is beneficial to extend the service life of the first sub-pixel 11.

Figure 10:
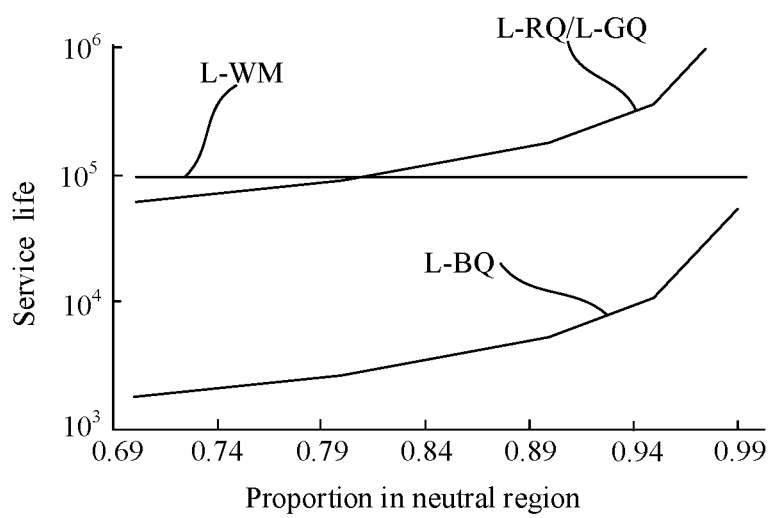
FIG. 10 is another schematic diagram illustrating a service life according to an embodiment of the present disclosure.

Through experiments, when the pixel arrangement structure in this embodiment is applied to the display substrate, the service lives of the first sub-pixel 11, the second sub-pixel 12, the third sub-pixel 13, and the fourth sub-pixel 14 under the condition of T95@1000 nits are shown in FIG. 10. A curve L-WM is a service life curve of the second sub-pixel 12.

As can be known from FIG. 10, the service life of the display substrate is still limited to the first sub-pixel 11 emitting blue light. However, when the proportions of color coordinates of light emitting colors of all pixel units on the display substrate in the neutral region of the chromaticity diagram shown in FIG. 7 are 95%, the service life of the display substrate may still reach about ten thousand hours, meeting the requirement of commercialization. Therefore, according to the technical solution provided in this embodiment, the service life of the display substrate can be extended.

In this embodiment, each pixel unit in the pixel arrangement structure includes the first sub-pixel and the second sub-pixel, where the first sub-pixel includes the first quantum dot light emitting diode, the second sub-pixel includes the inorganic light emitting diode, and the light emitting color of the second sub-pixel is white. The color gamut of the light emitting color of the pixel unit when the first sub-pixel emits light is wider than that when the second sub-pixel emits light, the second sub-pixel is more stable than the first sub-pixel, and the service life of the second sub-pixel is longer than that of the first sub-pixel. Therefore, color coordinates of a light emitting color of each pixel unit can be determined according to image data of a to-be-displayed image. When the color coordinates of the light emitting color of the pixel unit are located within the first color gamut corresponding to the second sub-pixel, the second sub-pixel is controlled to emit light, and the first sub-pixel is prohibited from emitting light. When the color coordinates of the light emitting color of the pixel unit are located outside the first color gamut and within the second color gamut corresponding to the first sub-pixel, the first sub-pixel is controlled to emit light. In this way, when the pixel arrangement structure is applied to a display substrate, a cumulative duration for the first sub-pixel to emit light can be reduced, which is beneficial to extend the service life of the first sub-pixel and further beneficial to extend a service life of the display substrate, making the display substrate have advantages of both wide color gamut and long service life.

An embodiment of the present disclosure provides a pixel arrangement structure.

Different from the above embodiments, in this embodiment, each pixel unit may include one first sub-pixel 11, two second sub-pixels 12, one third sub-pixel 13, and one fourth sub-pixel 14. The light emitting color of the first sub-pixel 11 is blue, the light emitting color of the third sub-pixel 13 is red, and the light emitting color of the fourth sub-pixel 14 is green. The light emitting color of one of the two second sub-pixels 12 is blue, and the light emitting color of the other one of the two second sub-pixels 12 is white. For the convenience of description, the reference sign of the second sub-pixel 12 with the light emitting color being blue is denoted as 121, and the reference sign of the second sub-pixel 12 with the light emitting color being white is denoted as 122.

Figure 11:
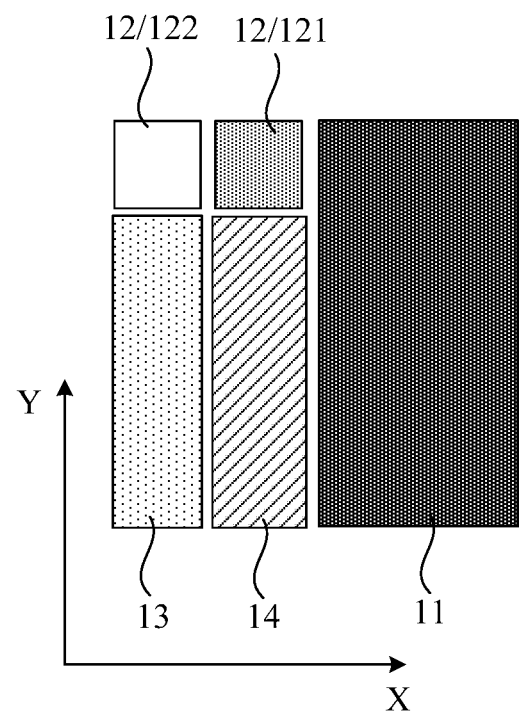
FIG. 11 is a structural schematic diagram illustrating another pixel arrangement structure according to an embodiment of the present disclosure.

In this embodiment, as shown in FIG. 11, the third sub-pixel 13, the fourth sub-pixel 14, and the first sub-pixel 11 are arranged in a row in the first direction X, and sizes of the two second sub-pixels 12 are smaller than that of the first sub-pixel 11. The second sub-pixel 122 and the third sub-pixel 13 are arranged in a column in the second direction Y, and the second sub-pixel 121 and the fourth sub-pixel 14 are arranged in a column in the second direction Y In the second direction Y, a total length of the second sub-pixel 122 and the third sub-pixel 13 may be slightly shorter than the length of the first sub-pixel 11, and a total length of the second sub-pixel 121 and the fourth sub-pixel 14 may be slightly shorter than the length of the first sub-pixel 11. In the second direction Y, a length of the second sub-pixel 122 is shorter than that of the third sub-pixel 13. That is, space may be made for the second sub-pixel 122 by reducing the length of the third sub-pixel 13. In the second direction Y, a length of the second sub-pixel 121 is shorter than that of the fourth sub-pixel 14. That is, space may be made for the second sub-pixel 121 by reducing the length of the fourth sub-pixel 14. In this way, the influence of the second sub-pixel on a display resolution can be avoided.

Figure 12:
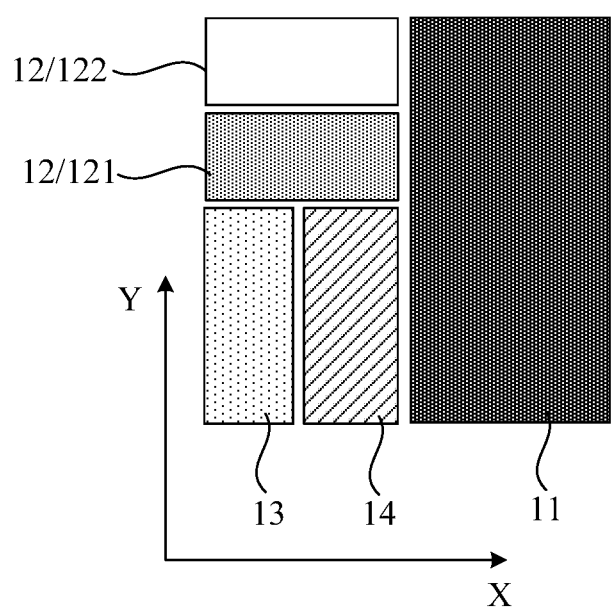
FIG. 12 is a structural schematic diagram illustrating another pixel arrangement structure according to an embodiment of the present disclosure.

In other embodiments, as shown in FIG. 12, the third sub-pixel 13, the fourth sub-pixel 14, and the first sub-pixel 11 are arranged in a row in the first direction X, the second sub-pixel 121, the second sub-pixel 122, and the third sub-pixel 13 are arranged in the second direction Y, and the second sub-pixel 121, the second sub-pixel 122, and the fourth sub-pixel 14 are arranged in the second direction Y In the second direction Y, the length of the third sub-pixel 13 is substantially the same as that of the fourth sub-pixel 14, and is shorter than that of the first sub-pixel 11. In the first direction X, the length of the second sub-pixel 121 is the same as that of the second sub-pixel 122, and a sum of the length of the third sub-pixel 13 and the length of the fourth sub-pixel 14 is slightly smaller than the length of the second sub-pixel 121. In the second direction Y, a total length of the second sub-pixel 121, the second sub-pixel 122, and the third sub-pixel 13 may be slightly shorter than the length of the first sub-pixel 11, and a total length of the second sub-pixel 121, the second sub-pixel 122, and the fourth sub-pixel 14 may be slightly shorter than the length of the first sub-pixel 11. That is, space may be made for the second sub-pixel 121 and the second sub-pixel 122 by reducing the length of the third sub-pixel 13 and the length of the fourth sub-pixel 14. In this way, the influence of the second sub-pixel on a display resolution can be avoided.

Figure 13:
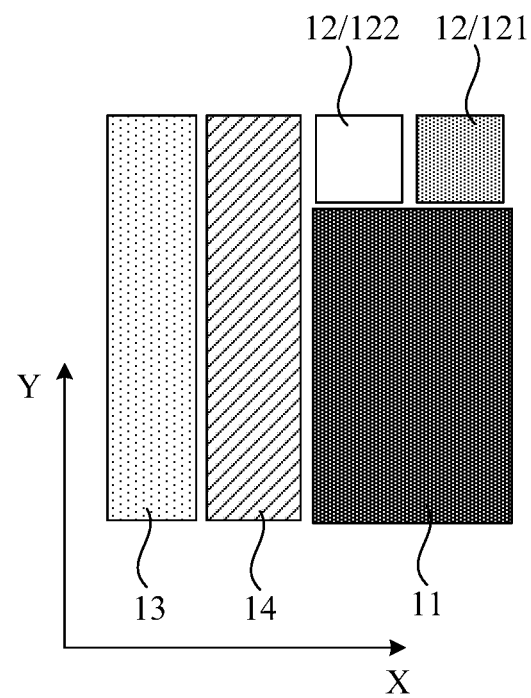
FIG. 13 is a structural schematic diagram illustrating another pixel arrangement structure according to an embodiment of the present disclosure.

In other embodiments, as shown in FIG. 13, the third sub-pixel 13, the fourth sub-pixel 14, and the first sub-pixel 11 are arranged in a row in the first direction X, the second sub-pixel 121 and the first sub-pixel 11 are arranged in the second direction Y, and the second sub-pixel 122 and the first sub-pixel 11 are arranged in the second direction Y The second sub-pixel 121 and the second sub-pixel 122 are arranged in a row in the first direction X. The length of the fourth sub-pixel 14 in the second direction Y is the same as that of the third sub-pixel 13 in the second direction Y The length of the first sub-pixel 11 in the second direction Y is shorter than that of the third sub-pixel 13 in the second direction Y That is, space may be made for the second sub-pixel 121 and the second sub-pixel 122 by reducing the length of the first sub-pixel 11 in the second direction Y In this way, the influence of the second sub-pixel on a display resolution can be avoided.

Figure 14:
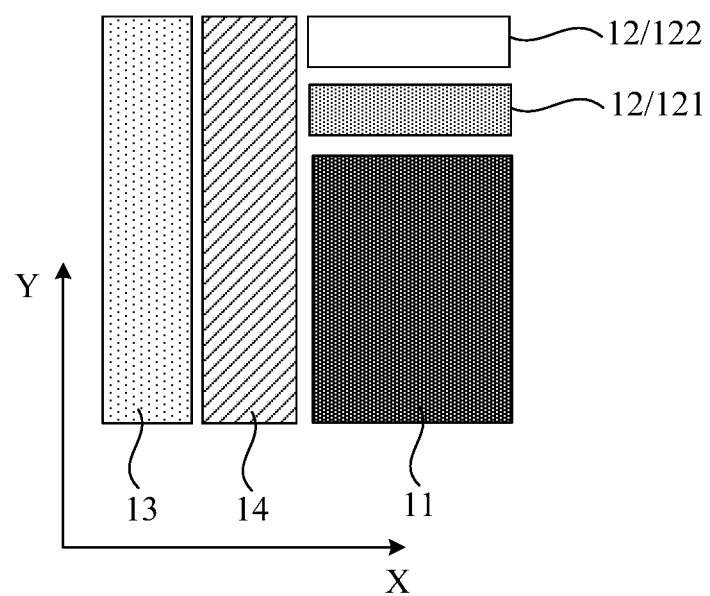
FIG. 14 is a structural schematic diagram illustrating another pixel arrangement structure according to an embodiment of the present disclosure.

In other embodiments, as shown in FIG. 14, the third sub-pixel 13, the fourth sub-pixel 14, and the first sub-pixel 11 are arranged in a row in the first direction X, and the second sub-pixel 121, the second sub-pixel 122, and the first sub-pixel 11 are arranged in a column in the second direction Y In the second direction Y, the length of the second sub-pixel 121 is the same as that of the second sub-pixel 122, the length of the second sub-pixel 121 is shorter than that of the first sub-pixel 11, and the length of the first sub-pixel 11 is shorter than that of the third sub-pixel 13. That is, space may be made for the second sub-pixel 121 and the second sub-pixel 122 by reducing the length of the first sub-pixel 11 in the second direction Y In this way, the influence of the second sub-pixel on a display resolution can be avoided.

Figure 15:
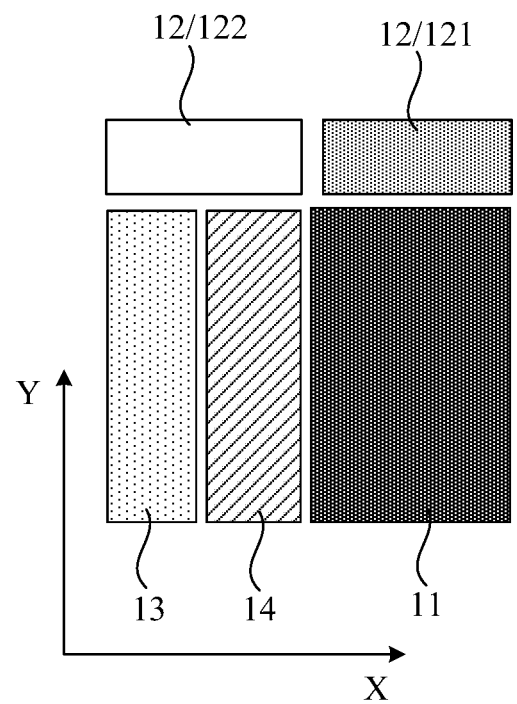
FIG. 15 is a structural schematic diagram illustrating another pixel arrangement structure according to an embodiment of the present disclosure.

In other embodiments, as shown in FIG. 15, the third sub-pixel 13, the fourth sub-pixel 14, and the first sub-pixel 11 are arranged in a row in the first direction X, the second sub-pixel 121 and the first sub-pixel 11 are arranged in the second direction Y, the second sub-pixel 122 and the third sub-pixel 13 are arranged in the second direction Y, and the second sub-pixel 122 and the fourth sub-pixel 14 are arranged in the second direction Y In the first direction X, the length of the second sub-pixel 121 is the same as that of the first sub-pixel 11, and the sum of the length of the third sub-pixel 13 and the length of the fourth sub-pixel 14 is slightly smaller than the length of the second sub-pixel 122. In the second direction Y, the length of the third sub-pixel 13, the length of the fourth sub-pixel 14, and the length of the first sub-pixel 11 are same, and a sum of the length of the first sub-pixel 11 and the length of the second sub-pixel 121 is equal to that of the length of the fourth sub-pixel 14 and the length of the second sub-pixel 122.

Figure 16:
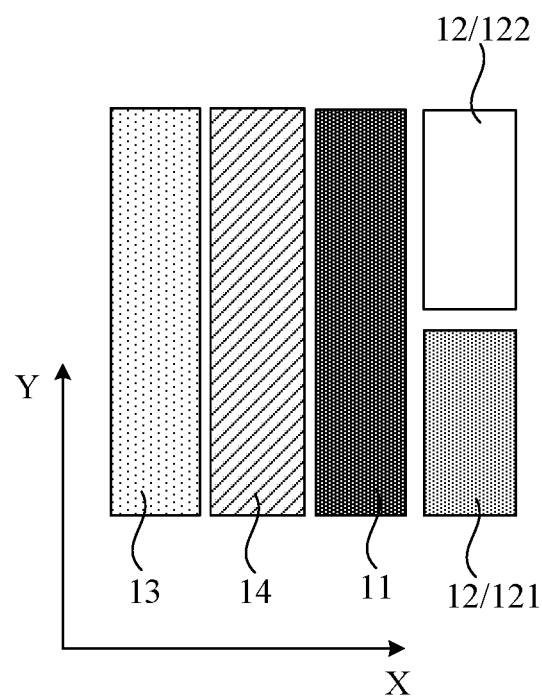
FIG. 16 is a structural schematic diagram illustrating another pixel arrangement structure according to an embodiment of the present disclosure.

In other embodiments, as shown in FIG. 16, the third sub-pixel 13, the fourth sub-pixel 14, the first sub-pixel 11, and the second sub-pixel 121 are arranged in a row in the first direction X, the third sub-pixel 13, the fourth sub-pixel 14, the first sub-pixel 11, and the second sub-pixel 122 are arranged in a row in the first direction X, and the second sub-pixel 121 and the second sub-pixel 122 are arranged in a column in the second direction Y. In the second direction Y, a sum of the length of the second sub-pixel 121 and the length of the second sub-pixel 122 is slightly smaller than the length of the third sub-pixel 13. In the first direction X, the length of the second sub-pixel 121 is the same as that of the second sub-pixel 122, and the length of the second sub-pixel 121, the length of the third sub-pixel 13, the length of the fourth sub-pixel 14, and the length of the first sub-pixel 11 are same.

It should be noted that, in the pixel unit shown in FIGS. 11 to 16, a position of the second sub-pixel 121 and a position of the second sub-pixel 122 are interchangeable.

In this embodiment, each pixel unit in the pixel arrangement structure includes one first sub-pixel and two second sub-pixels, where the first sub-pixel includes the first quantum dot light emitting diode, each of the two second sub-pixels includes the inorganic light emitting diode, the light emitting color of the first sub-pixel is blue, the light emitting color of one of the two second sub-pixels is blue, and the light emitting color of the other one of the two second sub-pixels is white. The color gamut of the light emitting color of the pixel unit when the first sub-pixel emits light is wider than that when the second sub-pixel emits light, the second sub-pixel is more stable than the first sub-pixel, and the service life of the second sub-pixel is longer than that of the first sub-pixel. Therefore, color coordinates of a light emitting color of each pixel unit can be determined according to image data of a to-be-displayed image. When the color coordinates of the light emitting color of the pixel unit are located within the first color gamut corresponding to the second sub-pixel, the second sub-pixel is controlled to emit light, and the first sub-pixel is prohibited from emitting light. When the color coordinates of the light emitting color of the pixel unit are located outside the first color gamut and within the second color gamut corresponding to the first sub-pixel, the first sub-pixel is controlled to emit light. In this way, when the pixel arrangement structure is applied to a display substrate, a cumulative duration for the first sub-pixel to emit light can be reduced, which is beneficial to extend the service life of the first sub-pixel and further beneficial to extend a service life of the display substrate, making the display substrate have advantages of both wide color gamut and long service life.

An embodiment of the present disclosure provides a display substrate. The display substrate includes the pixel arrangement structure according to any one of the above embodiments.

Figure 17:
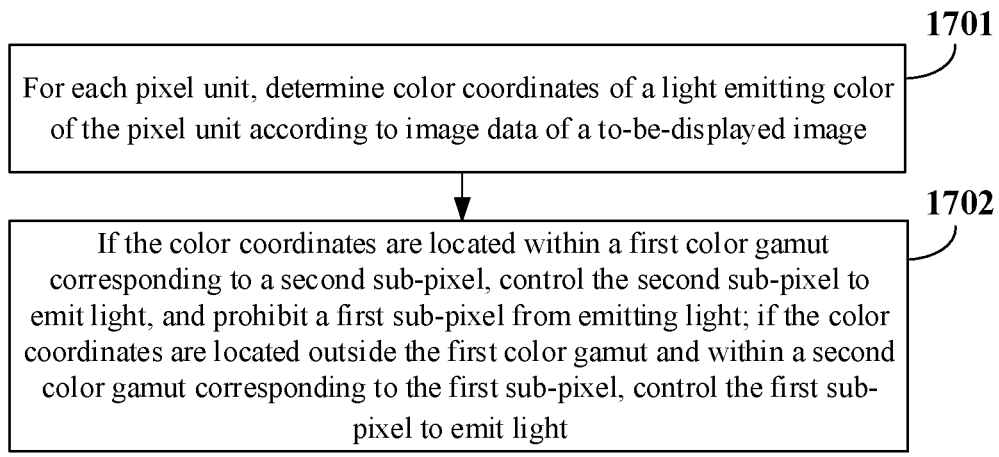
FIG. 17 is a flowchart illustrating a method for driving a pixel arrangement structure according to the embodiment of the present disclosure.

An embodiment of the present disclosure provides a method for driving a pixel arrangement structure. The method for driving a pixel arrangement structure is used to drive the pixel arrangement structure according to any one of the above embodiments. As shown in FIG. 17, the method for driving a pixel arrangement structure includes the following steps 1701-1702:

At step 1701, for each pixel unit, color coordinates of a light emitting color of the pixel unit are determined according to image data of a to-be-displayed image.

In this embodiment, when the pixel arrangement structure is applied to a display substrate, the display substrate, after receiving the image data of the to-be-displayed image, may determine the color coordinates of the light emitting color of each pixel unit according to the image data of the to-be-displayed image.

At step 1702, if the color coordinates are located within a first color gamut corresponding to a second sub-pixel, the second sub-pixel is controlled to emit light, and a first sub-pixel is prohibited from emitting light; if the color coordinates are located outside the first color gamut and within a second color gamut corresponding to the first sub-pixel, the first sub-pixel is controlled to emit light.

In this embodiment, for the color coordinates of the light emitting color of each pixel unit, if it is determined that the color coordinates are located within the first color gamut corresponding to the second sub-pixel, the second sub-pixel is controlled to emit light, and the first sub-pixel is prohibited from emitting light; if it is determined that the color coordinates are located outside the first color gamut and within the second color gamut corresponding to the first sub-pixel, the first sub-pixel is controlled to emit light. In this way, a cumulative duration for the first sub-pixel to emit light can be reduced, which is beneficial to extend a service life of the first sub-pixel and further beneficial to extend a service life of the display substrate, making the display substrate have advantages of both wide color gamut and long service life.

Figure 18:
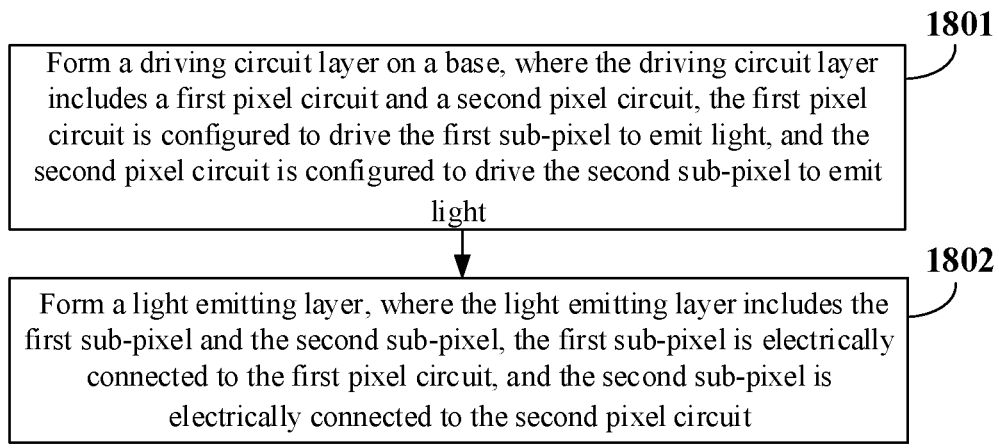
FIG. 18 is a flowchart illustrating a method for manufacturing a display substrate according to an embodiment of the present disclosure.

An embodiment of the present disclosure provides a method for manufacturing a display substrate. The method for manufacturing a display substrate is used to manufacture the display substrate according to any one of the above embodiments. As shown in FIG. 18, the method for manufacturing a display substrate includes the following steps 1801-1802:

At step 1801, a driving circuit layer is formed on a base, where the driving circuit layer includes a first pixel circuit and a second pixel circuit, the first pixel circuit is configured to drive the first sub-pixel to emit light, and the second pixel circuit is configured to drive the second sub-pixel to emit light.

At step 1802, a light emitting layer is formed, where the light emitting layer includes the first sub-pixel and the second sub-pixel, the first sub-pixel is electrically connected to the first pixel circuit, and the second sub-pixel is electrically connected to the second pixel circuit.

In this embodiment, the display substrate includes the pixel arrangement structure, and each pixel unit in the pixel arrangement structure includes the first sub-pixel and the second sub-pixel, where the first sub-pixel includes the first quantum dot light emitting diode, the second sub-pixel includes the inorganic light emitting diode, and the light emitting color of the second sub-pixel is the same as that of the first sub-pixel, or the light emitting color of the second sub-pixel is white. The color gamut of the light emitting color of the pixel unit when the first sub-pixel emits light is wider than that when the second sub-pixel emits light, the second sub-pixel is more stable than the first sub-pixel, and the service life of the second sub-pixel is longer than that of the first sub-pixel. Therefore, the color coordinates of the light emitting color of each pixel unit can be determined according to the image data of the to-be-displayed image. When the color coordinates of the light emitting color of the pixel unit are located within the first color gamut corresponding to the second sub-pixel, the second sub-pixel is controlled to emit light, and the first sub-pixel is prohibited from emitting light. When the color coordinates of the light emitting color of the pixel unit are located outside the first color gamut and within the second color gamut corresponding to the first sub-pixel, the first sub-pixel is controlled to emit light. In this way, when the pixel arrangement structure is applied to the display substrate, a cumulative duration for the first sub-pixel to emit light can be reduced, which is beneficial to extend the service life of the first sub-pixel and further beneficial to extend the service life of the display substrate, making the display substrate have advantages of both wide color gamut and long service life.

Figure 19:
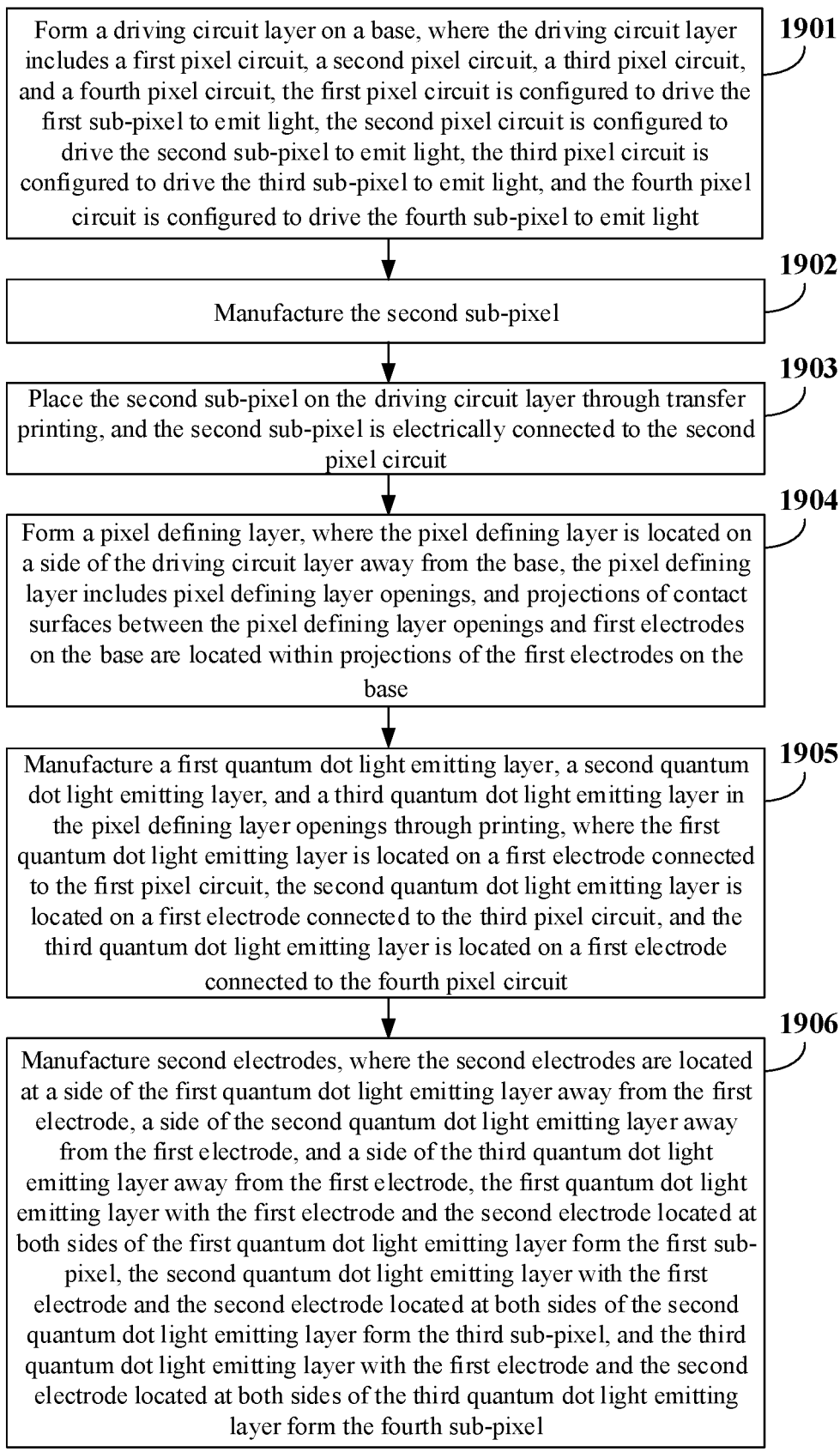
FIG. 19 is a flowchart illustrating another method for manufacturing a display substrate according to an embodiment of the present disclosure.

An embodiment of the present disclosure provides a method for manufacturing a display substrate. The method for manufacturing a display substrate is used to manufacture the display substrate according to any one of the above embodiments. As shown in FIG. 19, the method for manufacturing a display substrate includes the following steps 1901-1906:

At step 1901, a driving circuit layer is formed on a base, where the driving circuit layer includes a first pixel circuit, a second pixel circuit, a third pixel circuit, and a fourth pixel circuit, the first pixel circuit is configured to drive the first sub-pixel to emit light, the second pixel circuit is configured to drive the second sub-pixel to emit light, the third pixel circuit is configured to drive the third sub-pixel to emit light, and the fourth pixel circuit is configured to drive the fourth sub-pixel to emit light.

Figure 20:
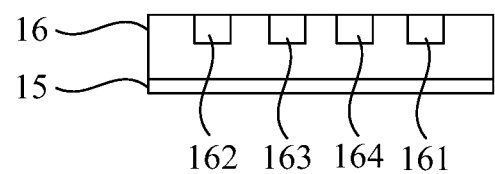
FIGS. 20 to 22 are schematic diagrams illustrating intermediate structures generated during the manufacturing of a display substrate according to embodiments of the present disclosure.

In this embodiment, after step 1901, an intermediate structure as shown in FIG. 20 may be obtained. In FIG. 20, a driving circuit layer 16 is located on a base 15. The driving circuit layer 16 includes a first pixel circuit 161, a second pixel circuit 162, a third pixel circuit 163, and a fourth pixel circuit 164.

In this embodiment, the first pixel circuit 161 includes an exposed first electrode, the third pixel circuit 163 includes an exposed first electrode, and the fourth pixel circuit 164 includes an exposed first electrode. The second pixel circuit 162 includes exposed first pad and second pad, where the first pad is configured to be electrically connected to a third electrode of the second sub-pixel, and the second pad is configured to be electrically connected to a fourth electrode of the second sub-pixel.

In this embodiment, the driving circuit layer includes at least one of thin film transistors (TFT) or Metal-Oxide-Semiconductor field effect transistors (MOS). For example, the driving circuit layer includes TFTs, or MOSs, or TFTs and MOSs.

At step 1902, the second sub-pixel is manufactured.

In this embodiment, the step of manufacturing the second sub-pixel and the step of forming the driving circuit layer on the base may be interchangeable.

At step 1903, the second sub-pixel is placed on the driving circuit layer through transfer printing, and the second sub-pixel is electrically connected to the second pixel circuit.

In this embodiment, the transfer printing may be thin film transfer printing. In other embodiments, the transfer printing may be electrostatic force transfer printing, Van der Waals force transfer printing, magnetic force transfer printing or self-assembling.

In this embodiment, after the second sub-pixel is placed on the driving circuit layer, the first pad may be electrically connected to the third electrode of the second sub-pixel, and the second pad may be electrically connected to the fourth electrode of the second sub-pixel, so as to achieve electrical connection between the second sub-pixel and the second pixel circuit.

At step 1904, a pixel defining layer is formed, where the pixel defining layer is located on a side of the driving circuit layer away from the base, the pixel defining layer includes pixel defining layer openings, and projections of contact surfaces between the pixel defining layer openings and first electrodes on the base are located within projections of the first electrodes on the base.

Figure 21:
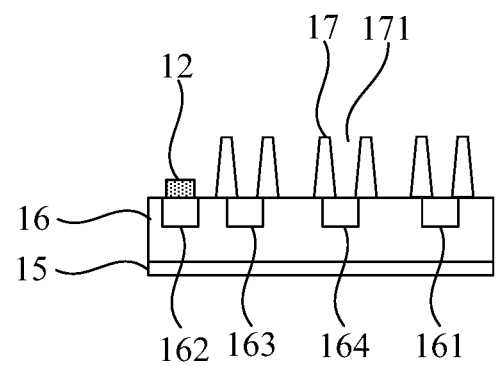

In this embodiment, after step 1904, an intermediate structure as shown in FIG. 21 may be obtained. As shown in FIG. 21, a pixel defining layer 17 may be formed on a side of the driving circuit layer 16 away from the base 15. The pixel defining layer 17 is provided with pixel defining layer openings 171, and projections of contact surfaces between the pixel defining layer openings 171 and first electrodes on the base 15 are located within projections of the first electrodes on the base 15. The pixel defining layer 17 does not cover the second sub-pixel 12, and a projection of the second sub-pixel 12 on the base 15 is located outside a projection of the pixel defining layer 17 on the base 15.

At step 1905, a first quantum dot light emitting layer, a second quantum dot light emitting layer, and a third quantum dot light emitting layer are manufactured in the pixel defining layer openings through printing, where the first quantum dot light emitting layer is located on a first electrode connected to the first pixel circuit, the second quantum dot light emitting layer is located on a first electrode connected to the third pixel circuit, and the third quantum dot light emitting layer is located on a first electrode connected to the fourth pixel circuit.

Figure 22:
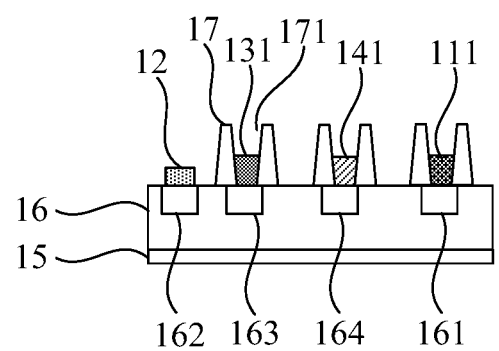

In this embodiment, as shown in FIG. 22, a first quantum dot light emitting layer 111 is located on a first electrode connected to the first pixel circuit 161, a second quantum dot light emitting layer 131 is located on a first electrode connected to the third pixel circuit 163, and a third quantum dot light emitting layer 141 is located on a first electrode connected to the fourth pixel circuit 164. The first quantum dot light emitting layer 111 is configured to emit blue light, the second quantum dot light emitting layer 131 is configured to emit red light, and the third quantum dot light emitting layer 141 is configured to emit green light.

In this embodiment, the printing may be ink-jet printing or e-jet printing, but is not limited thereto.

At step 1906, second electrodes are manufactured, where the second electrodes are located at a side of the first quantum dot light emitting layer away from the first electrode, a side of the second quantum dot light emitting layer away from the first electrode, and a side of the third quantum dot light emitting layer away from the first electrode, the first quantum dot light emitting layer with the first electrode and the second electrode located at both sides of the first quantum dot light emitting layer form the first sub-pixel, the second quantum dot light emitting layer with the first electrode and the second electrode located at both sides of the second quantum dot light emitting layer form the third sub-pixel, and the third quantum dot light emitting layer with the first electrode and the second electrode located at both sides of the third quantum dot light emitting layer form the fourth sub-pixel.

In this embodiment, before the pixel defining layer is formed, a surface of the driving circuit layer away from the base is relatively flat, and the second sub-pixel is placed on the driving circuit layer through transfer printing, which can avoid affecting transfer printing quality.

Figure 23:
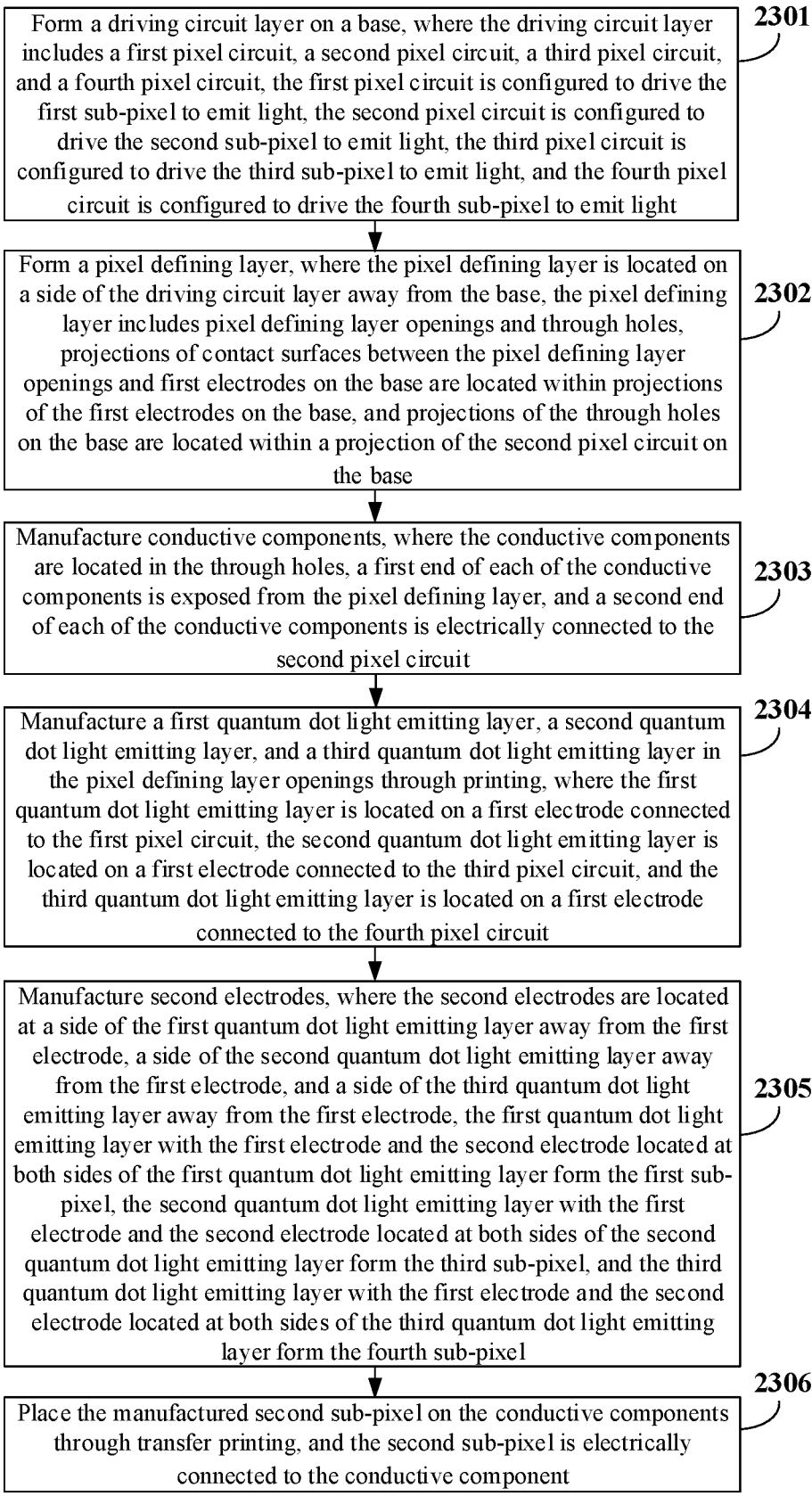
FIG. 23 is a flowchart illustrating another method for manufacturing a display substrate according to an embodiment of the present disclosure.

An embodiment of the present disclosure provides a method for manufacturing a display substrate. The method for manufacturing a display substrate is used to manufacture the display substrate according to any one of the above embodiments. As shown in FIG. 23, the method for manufacturing a display substrate includes the following steps 2301-2306:

At step 2301, a driving circuit layer is formed on a base, where the driving circuit layer includes a first pixel circuit, a second pixel circuit, a third pixel circuit, and a fourth pixel circuit, the first pixel circuit is configured to drive the first sub-pixel to emit light, the second pixel circuit is configured to drive the second sub-pixel to emit light, the third pixel circuit is configured to drive the third sub-pixel to emit light, and the fourth pixel circuit is configured to drive the fourth sub-pixel to emit light.

In this embodiment, after step 2301, an intermediate structure as shown in FIG. 20 may be obtained.

In this embodiment, a first pixel circuit 161 includes an exposed first electrode, a third pixel circuit 163 includes an exposed first electrode, and a fourth pixel circuit 164 includes an exposed first electrode. A second pixel circuit 162 includes exposed first pad and second pad, where the first pad is configured to be electrically connected to a third electrode of the second sub-pixel, and the second pad is configured to be electrically connected to a fourth electrode of the second sub-pixel.

At step 2302, a pixel defining layer is formed, where the pixel defining layer is located on a side of the driving circuit layer away from the base, the pixel defining layer includes pixel defining layer openings and through holes, projections of contact surfaces between the pixel defining layer openings and first electrodes on the base are located within projections of the first electrodes on the base, and projections of the through holes on the base are located within a projection of the second pixel circuit on the base.

Figure 24:
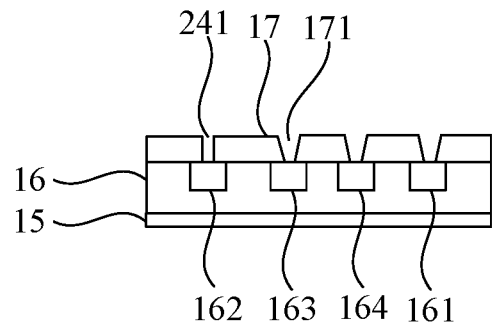
FIGS. 24 to 27 are schematic diagrams illustrating intermediate structures generated during the manufacturing of a display substrate according to embodiments of the present disclosure.

In this embodiment, as shown in FIG. 24, a pixel defining layer 17 is formed at a side of a driving circuit layer 16 away from a base 15. The pixel defining layer 17 may include pixel defining layer openings 171 and two through holes 241. Projections of contact surfaces between the pixel defining layer openings 171 and first electrodes on the base 15 are located within projections of the first electrodes on the base 15. A projection of one of the two through holes 241 on the base 15 is located within a projection of the first pad on the base 15, and a projection of the other one of the two through holes 241 on the base 15 is located within a projection of the second pad on the base 15.

At step 2303, conductive components are manufactured, where the conductive components are located in the through holes, a first end of each of the conductive components is exposed from the pixel defining layer, and a second end of each of the conductive components is electrically connected to the second pixel circuit.

Figure 25:
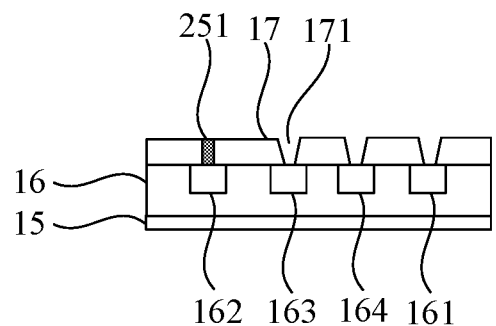

In this embodiment, as shown in FIG. 25, two conductive components 251 are manufactured, where one of the two conductive components 251 is located in one of the two through holes 241, and the other one of the two conductive components 251 is located in the other one of the two through holes 241. A second end of one of the two conductive components 251 is connected to the first pad, and a first end of the one of the two conductive components 251 is exposed from the pixel defining layer 17. A second end of the other one of the two conductive components 251 is connected to the second pad, and a first end of the other one of the two conductive components 251 is exposed from the pixel defining layer 17.

At step 2304, a first quantum dot light emitting layer, a second quantum dot light emitting layer, and a third quantum dot light emitting layer are manufactured in the pixel defining layer openings through printing, where the first quantum dot light emitting layer is located on a first electrode connected to the first pixel circuit, the second quantum dot light emitting layer is located on a first electrode connected to the third pixel circuit, and the third quantum dot light emitting layer is located on a first electrode connected to the fourth pixel circuit.

Figure 26:
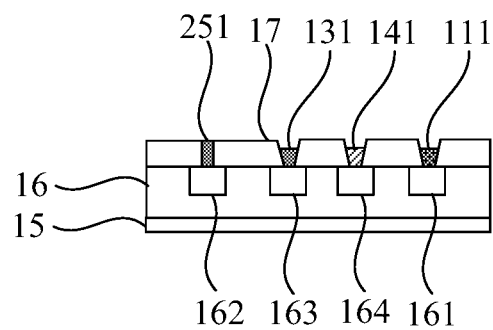

In this embodiment, as shown in FIG. 26, a first quantum dot light emitting layer 111 is located on a first electrode connected to the first pixel circuit 161, a second quantum dot light emitting layer 131 is located on a first electrode connected to the third pixel circuit 163, and a third quantum dot light emitting layer 141 is located on a first electrode connected to the fourth pixel circuit 164. The first quantum dot light emitting layer 111 is configured to emit blue light, the second quantum dot light emitting layer 131 is configured to emit red light, and the third quantum dot light emitting layer 141 is configured to emit green light.

At step 2305, second electrodes are manufactured, where the second electrodes are located at a side of the first quantum dot light emitting layer away from the first electrode, a side of the second quantum dot light emitting layer away from the first electrode, and a side of the third quantum dot light emitting layer away from the first electrode, the first quantum dot light emitting layer with the first electrode and the second electrode located at both sides of the first quantum dot light emitting layer form the first sub-pixel, the second quantum dot light emitting layer with the first electrode and the second electrode located at both sides of the second quantum dot light emitting layer form the third sub-pixel, and the third quantum dot light emitting layer with the first electrode and the second electrode located at both sides of the third quantum dot light emitting layer form the fourth sub-pixel.

At step 2306, the manufactured second sub-pixel is placed on the conductive components through transfer printing, and the second sub-pixel is electrically connected to the conductive components.

In this embodiment, the step of manufacturing the second sub-pixel may be before step 2306. For example, the step of manufacturing the second sub-pixel may be before step 2301, or after step 2305 and before step 2306, but is not limited thereto.

In this embodiment, the transfer printing may be electrostatic force transfer printing, but is not limited thereto.

In this embodiment, a third electrode of a second sub-pixel 12 may be connected to the first pad through one conductive component, and a fourth electrode of the second sub-pixel 12 may be connected to the second pad through the other conductive component, so as to achieve electrical connection between the second sub-pixel 12 and the second pixel circuit 162.

In this embodiment, since a side surface of the pixel defining layer away from the base is flat, even if the first sub-pixel, the third sub-pixel, and the fourth sub-pixel are manufactured first, and then the manufactured second sub-pixel is placed on the conductive components through transfer printing, the quality transfer printing can be avoided to be affected.

Figure 28:
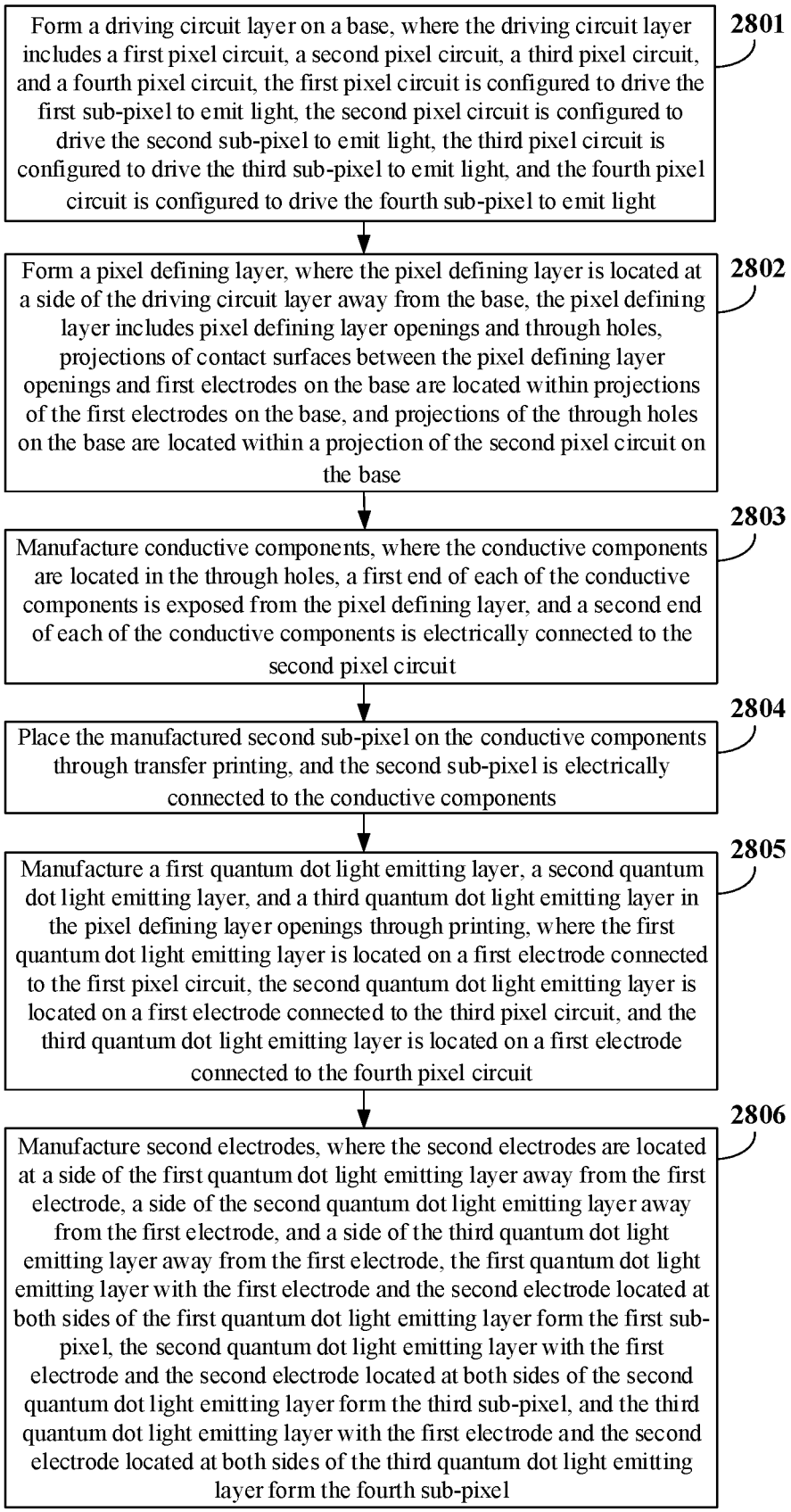
FIG. 28 is a flowchart illustrating another method for manufacturing a display substrate according to an embodiment of the present disclosure.

An embodiment of the present disclosure provides a method for manufacturing a display substrate. The method for manufacturing a display substrate is used to manufacture the display substrate according to any one of the above embodiments. As shown in FIG. 28, the method for manufacturing a display substrate includes the following steps 2801 to 2806:

At step 2801, a driving circuit layer is formed on a base, where the driving circuit layer includes a first pixel circuit, a second pixel circuit, a third pixel circuit, and a fourth pixel circuit. The first pixel circuit is configured to drive the first sub-pixel to emit light, the second pixel circuit is configured to drive the second sub-pixel to emit light, the third pixel circuit is configured to drive the third sub-pixel to emit light, and the fourth pixel circuit is configured to drive the fourth sub-pixel to emit light.

In this embodiment, after step 2801, an intermediate structure as shown in FIG. 20 may be obtained.

In this embodiment, a first pixel circuit 161 includes an exposed first electrode, a third pixel circuit 163 includes an exposed first electrode, and a fourth pixel circuit 164 includes an exposed first electrode. A second pixel circuit 162 includes exposed first pad and second pad, where the first pad is configured to be electrically connected to a third electrode of the second sub-pixel, and the second pad is configured to be electrically connected to a fourth electrode of the second sub-pixel.

At step 2802, a pixel defining layer is formed, where the pixel defining layer is located at a side of the driving circuit layer away from the base, the pixel defining layer includes pixel defining layer openings and through holes, projections of contact surfaces between the pixel defining layer openings and first electrodes on the base are located within projections of the first electrodes on the base, and projections of the through holes on the base are located within a projection of the second pixel circuit on the base.

In this embodiment, as shown in FIG. 24, a pixel defining layer 17 is formed at a side of a driving circuit layer 16 away from a base 15. The pixel defining layer 17 may include pixel defining layer openings 171 and two through holes 241. Projections of contact surfaces between the pixel defining layer openings 171 and first electrodes on the base 15 are located within projections of the first electrodes on the base 15. A projection of one of the two through holes 241 on the base 15 is located within a projection of the first pad on the base 15, and a projection of the other one of the two through holes 241 on the base 15 is located within a projection of the second pad on the base 15.

At step 2803, conductive components are manufactured, where the conductive components are located in the through holes, a first end of each of the conductive components is exposed from the pixel defining layer, and a second end of each of the conductive components is electrically connected to the second pixel circuit.

In this embodiment, as shown in FIG. 25, two conductive components 251 are manufactured, where one of the two conductive components 251 is located in one of the two through holes 241, and the other one of the two conductive components 251 is located in the other one of the two through holes 241. A second end of one of the two conductive components 251 is connected to the first pad, and a first end of the one of the two conductive components 251 is exposed from the pixel defining layer 17. A second end of the other one of the two conductive components 251 is connected to the second pad, and a first end of the other one of the two conductive components 251 is exposed from the pixel defining layer 17.

At step 2804, the manufactured second sub-pixel is placed on the conductive components through transfer printing, and the second sub-pixel is electrically connected to the conductive components.

In this embodiment, the step of manufacturing the second sub-pixel may be before step 2804. For example, the step of manufacturing the second sub-pixel may be before step 2801, or before step 2803, but is not limited thereto.

In this embodiment, the transfer printing may be electrostatic force transfer printing, but is not limited thereto.

Figure 29:
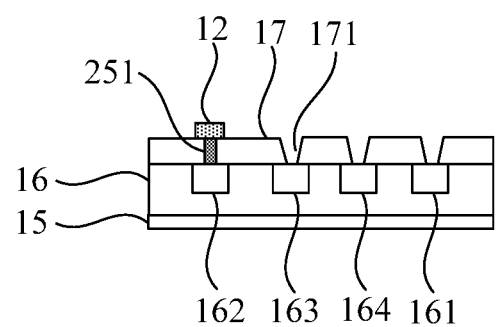
FIG. 29 is a schematic diagram illustrating an intermediate structure generated during the manufacturing of a display substrate according to an embodiment of the present disclosure.

In this embodiment, as shown in FIG. 29, the manufactured second sub-pixel is placed on the conductive components 251 through transfer printing, a third electrode of a second sub-pixel 12 may be connected to the first pad through one conductive component, and a fourth electrode of the second sub-pixel 12 may be connected to the second pad through the other conductive component, so as to achieve electrical connection between the second sub-pixel 12 and the second pixel circuit 162.

At step 2805, a first quantum dot light emitting layer, a second quantum dot light emitting layer, and a third quantum dot light emitting layer are manufactured in the pixel defining layer openings through printing, where the first quantum dot light emitting layer is located on a first electrode connected to the first pixel circuit, the second quantum dot light emitting layer is located on a first electrode connected to the third pixel circuit, and the third quantum dot light emitting layer is located on a first electrode connected to the fourth pixel circuit.

Figure 27:
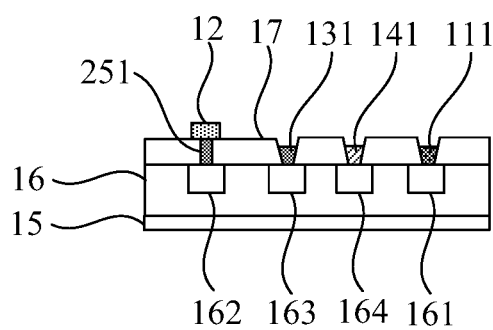

In this embodiment, as shown in FIG. 27, a first quantum dot light emitting layer 111 is located on a first electrode connected to the first pixel circuit 161, a second quantum dot light emitting layer 131 is located on a first electrode connected to the third pixel circuit 163, and a third quantum dot light emitting layer 141 is located on a first electrode connected to the fourth pixel circuit 164. The first quantum dot light emitting layer 111 is configured to emit blue light, the second quantum dot light emitting layer 131 is configured to emit red light, and the third quantum dot light emitting layer 141 is configured to emit green light.

At step 2806, second electrodes are manufactured, where the second electrodes are located at a side of the first quantum dot light emitting layer away from the first electrode, a side of the second quantum dot light emitting layer away from the first electrode, and a side of the third quantum dot light emitting layer away from the first electrode, the first quantum dot light emitting layer with the first electrode and the second electrode located at both sides of the first quantum dot light emitting layer form the first sub-pixel, the second quantum dot light emitting layer with the first electrode and the second electrode located at both sides of the second quantum dot light emitting layer form the third sub-pixel, and the third quantum dot light emitting layer with the first electrode and the second electrode located at both sides of the third quantum dot light emitting layer form the fourth sub-pixel.

In this embodiment, since a side surface of the pixel defining layer away from the base is flat, even if, after the pixel defining layer is manufactured, the manufactured second sub-pixel is placed on the pixel defining layer through transfer printing, the quality of transfer printing can be avoided to be affected.

Figure 30:
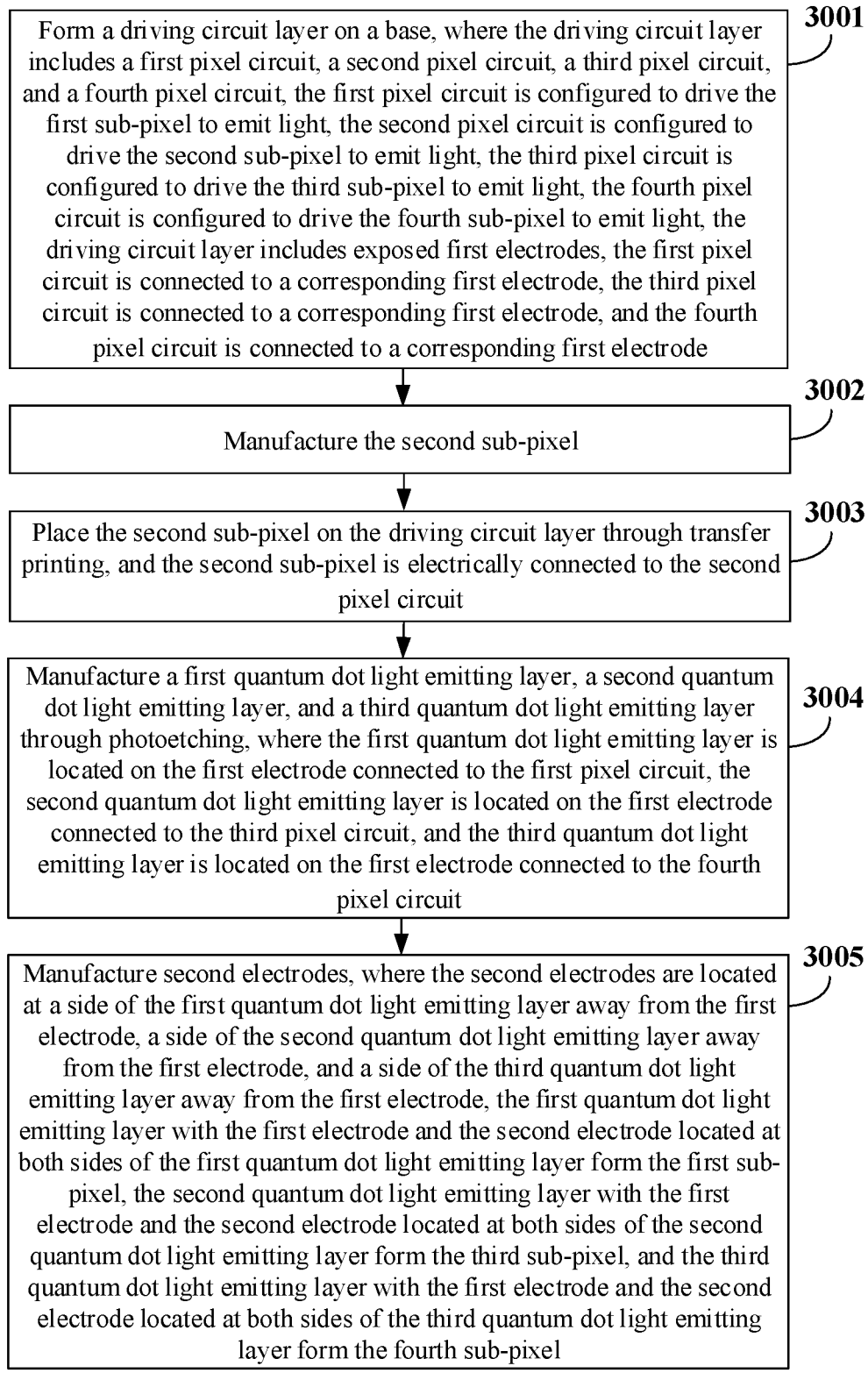
FIG. 30 is a flowchart illustrating another method for manufacturing a display substrate according to an embodiment of the present disclosure.

An embodiment of the present disclosure provides a method for manufacturing a display substrate. The method for manufacturing a display substrate is used to manufacture the display substrate according to any one of the above embodiments. As shown in FIG. 30, the method for manufacturing a display substrate includes the following steps 3001-3005:

At step 3001, a driving circuit layer is formed on a base, where the driving circuit layer includes a first pixel circuit, a second pixel circuit, a third pixel circuit, and a fourth pixel circuit. The first pixel circuit is configured to drive the first sub-pixel to emit light, the second pixel circuit is configured to drive the second sub-pixel to emit light, the third pixel circuit is configured to drive the third sub-pixel to emit light, the fourth pixel circuit is configured to drive the fourth sub-pixel to emit light, the driving circuit layer includes exposed first electrodes, the first pixel circuit is connected to a corresponding first electrode, the third pixel circuit is connected to a corresponding first electrode, and the fourth pixel circuit is connected to a corresponding first electrode.

In this embodiment, after step 3001, an intermediate structure as shown in FIG. 20 may be obtained.

In this embodiment, a second pixel circuit 162 includes exposed first pad and second pad, where the first pad is configured to be electrically connected to a third electrode of the second sub-pixel, and the second pad is configured to be electrically connected to a fourth electrode of the second sub-pixel.

At step 3002, the second sub-pixel is manufactured.

In this embodiment, the step of manufacturing the second sub-pixel and the step of forming the driving circuit layer on the base may be interchangeable.

At step 3003, the second sub-pixel is placed on the driving circuit layer through transfer printing, and the second sub-pixel is electrically connected to the second pixel circuit.

In this embodiment, the transfer printing may be Van der Waals force transfer printing. In other embodiments, the transfer printing may be electrostatic force transfer printing, magnetic force transfer printing or self-assembling.

Figure 31:
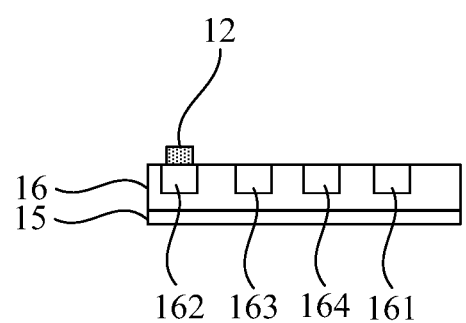
FIGS. 31 to 32 are schematic diagrams illustrating intermediate structures generated during the manufacturing of a display substrate according to embodiments of the present disclosure.

In this embodiment, as shown in FIG. 31, after the second sub-pixel is placed on the driving circuit layer, the first pad may be electrically connected to the third electrode of the second sub-pixel, and the second pad may be electrically connected to the fourth electrode of the second sub-pixel, so as to achieve electrical connection between the second sub-pixel 12 and the second pixel circuit.

At step 3004, a first quantum dot light emitting layer, a second quantum dot light emitting layer, and a third quantum dot light emitting layer are manufactured through photoetching, where the first quantum dot light emitting layer is located on the first electrode connected to the first pixel circuit, the second quantum dot light emitting layer is located on the first electrode connected to the third pixel circuit, and the third quantum dot light emitting layer is located on the first electrode connected to the fourth pixel circuit.

Figure 32:
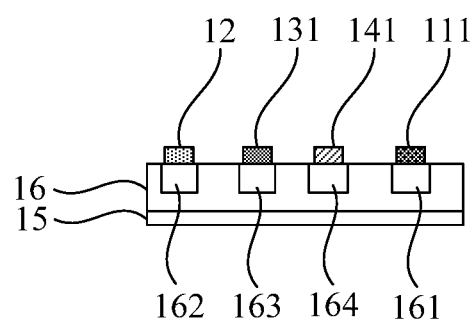

In this embodiment, as shown in FIG. 32, a first quantum dot light emitting layer 111 is located on a first electrode connected to a first pixel circuit 161, a second quantum dot light emitting layer 131 is located on a first electrode connected to a third pixel circuit 163, and a third quantum dot light emitting layer 141 is located on a first electrode connected to a fourth pixel circuit 164. The first quantum dot light emitting layer 111 is configured to emit blue light, the second quantum dot light emitting layer 131 is configured to emit red light, and the third quantum dot light emitting layer 141 is configured to emit green light.

In this embodiment, a material for the first quantum dot light emitting layer, the second quantum dot light emitting layer, and the third quantum dot light emitting layer may be photoresist, and be manufactured through photoetching. Since the first quantum dot light emitting layer, the second quantum dot light emitting layer, and the third quantum dot light emitting layer are manufactured through photoetching, there may be no need to manufacture a pixel defining layer, which can save processes and reduce cost.

At step 3005, second electrodes are manufactured, where the second electrodes are located at a side of the first quantum dot light emitting layer away from the first electrode, a side of the second quantum dot light emitting layer away from the first electrode, and a side of the third quantum dot light emitting layer away from the first electrode, the first quantum dot light emitting layer with the first electrode and the second electrode located at both sides of the first quantum dot light emitting layer form the first sub-pixel, the second quantum dot light emitting layer with the first electrode and the second electrode located at both sides of the second quantum dot light emitting layer form the third sub-pixel, and the third quantum dot light emitting layer with the first electrode and the second electrode located at both sides of the third quantum dot light emitting layer form the fourth sub-pixel.

An embodiment of the present disclosure provides a method for manufacturing a display substrate. The method for manufacturing a display substrate is used to manufacture the display substrate according to any one of the above embodiments. As shown in FIG. 33, the method for manufacturing a display substrate includes the following steps 3301-3304:

At step 3301, a driving circuit layer is formed on a base, where the driving circuit layer includes a first pixel circuit, a second pixel circuit, a third pixel circuit, and a fourth pixel circuit, the first pixel circuit is configured to drive the first sub-pixel to emit light. The second pixel circuit is configured to drive the second sub-pixel to emit light, the third pixel circuit is configured to drive the third sub-pixel to emit light, the fourth pixel circuit is configured to drive the fourth sub-pixel to emit light. The driving circuit layer includes exposed first electrodes, the first pixel circuit is connected to a corresponding first electrode, the third pixel circuit is connected to a corresponding first electrode, and the fourth pixel circuit is connected to a corresponding first electrode.

In this embodiment, after step 3301, an intermediate structure as shown in FIG. 20 may be obtained.

In this embodiment, a second pixel circuit 162 includes exposed first pad and second pad, where the first pad is configured to be electrically connected to a third electrode of the second sub-pixel, and the second pad is configured to be electrically connected to a fourth electrode of the second sub-pixel.

At step 3302, a first quantum dot light emitting layer, a second quantum dot light emitting layer, and a third quantum dot light emitting layer are manufactured through photoetching, where the first quantum dot light emitting layer is located on the first electrode connected to the first pixel circuit, the second quantum dot light emitting layer is located on the first electrode connected to the third pixel circuit, and the third quantum dot light emitting layer is located on the first electrode connected to the fourth pixel circuit.

Figure 34:
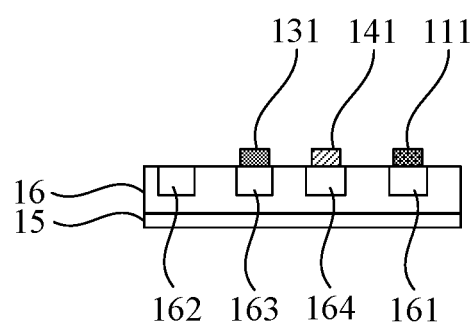
FIG. 34 is a schematic diagram illustrating an intermediate structure generated during the manufacturing of a display substrate according to an embodiment of the present disclosure.

In this embodiment, as shown in FIG. 34, a first quantum dot light emitting layer 111 is located on a first electrode connected to a first pixel circuit 161, a second quantum dot light emitting layer 131 is located on a first electrode connected to a third pixel circuit 163, and a third quantum dot light emitting layer 141 is located on a first electrode connected to a fourth pixel circuit 164. The first quantum dot light emitting layer 111 is configured to emit blue light, the second quantum dot light emitting layer 131 is configured to emit red light, and the third quantum dot light emitting layer 141 is configured to emit green light.

In this embodiment, a material for the first quantum dot light emitting layer, the second quantum dot light emitting layer, and the third quantum dot light emitting layer may be photoresist, and be manufactured through photoetching. Since the first quantum dot light emitting layer, the second quantum dot light emitting layer, and the third quantum dot light emitting layer are manufactured through photoetching, there may be no need to manufacture a pixel defining layer, which can save processes and reduce cost.

At step 3303, second electrodes are manufactured, where the second electrodes are located at a side of the first quantum dot light emitting layer away from the first electrode, a side of the second quantum dot light emitting layer away from the first electrode, and a side of the third quantum dot light emitting layer away from the first electrode. The first quantum dot light emitting layer with the first electrode and the second electrode located at both sides of the first quantum dot light emitting layer form the first sub-pixel, the second quantum dot light emitting layer with the first electrode and the second electrode located at both sides of the second quantum dot light emitting layer form the third sub-pixel, and the third quantum dot light emitting layer with the first electrode and the second electrode located at both sides of the third quantum dot light emitting layer form the fourth sub-pixel.

At step 3304, the manufactured second sub-pixel is placed on the driving circuit layer through transfer printing, and the second sub-pixel is electrically connected to the second pixel circuit.

In this embodiment, the step of manufacturing the second sub-pixel may be before step 3304. For example, the step of manufacturing the second sub-pixel may be before step 3301, or before step 3303, but is not limited thereto.

In this embodiment, the transfer printing may be electrostatic force transfer printing, but is not limited thereto.

In this embodiment, as shown in FIG. 32, the manufactured second sub-pixel is placed on the driving circuit layer through transfer printing, a third electrode of a second sub-pixel 12 may be connected to the first pad, and a fourth electrode of the second sub-pixel 12 may be connected to the second pad, so as to achieve electrical connection between the second sub-pixel 12 and the second pixel circuit 162.

It should be noted that a display device in the embodiments may be any product or component having a display function, such as electronic paper, a mobile phone, a tablet computer, a television, a notebook computer, a digital photo frame, or a navigator.

Formation technologies adopted in the above processes may include deposition, sputtering and other film forming technologies, as well as etching and other patterning technologies.

It should be pointed out that, in the drawings, sizes of layers and areas may be exaggerated for clarity of illustration. It will be understood that, when an element or layer is referred to as being "on" another element or layer, it can be directly on other element, or an intermediate layer may be present. In addition, it will be understood that, when an element or layer is referred to as being "below" another element or layer, it can be directly below other element, or more than one intermediate layer or element may be present. It will also be understood that, when a layer or element is referred to as being "between" two layers or elements, it can be the only layer between the two layers or elements, or more than one intermediate layer or element may be present. Similar reference signs indicate similar elements throughout the present application.

In the present disclosure, terms "first" and "second" are used only for descriptive purposes, and cannot be understood as indicating or implying relative importance. Terms "multiple" and "plurality" refer to two or more, unless otherwise defined clearly.

Although the present disclosure is disclosed above, the present disclosure is not limited thereto. Any person skilled in the art can make various changes and modifications without departing from the spirit and scope of the present disclosure. Therefore, the protection scope of the present disclosure should be based on the scope defined by the claims.

The invention claimed is:

1. A pixel arrangement structure, comprising: pixel units arranged in an array, wherein each of the pixel units comprises a first sub-pixel and a second sub-pixel, the first sub-pixel comprises a first quantum dot light emitting diode, the second sub-pixel comprises an inorganic light emitting diode, a light emitting color of the second sub-pixel is identical to that of the first sub-pixel, or the light emitting color of the second sub-pixel is white;

wherein the pixel arrangement structure further comprises two second sub-pixels;

wherein each of the pixel units further comprises a third sub-pixel and a fourth sub-pixel, wherein in each of the pixel units, the third sub-pixel, the fourth sub-pixel, and the first sub-pixel are arranged side by side in a first direction, and a size of each of the two second sub-pixels is smaller than a size of the first sub-pixel; one of the two second sub-pixels and the third sub-pixel are arranged side by side in a second direction, and the other one of the two second sub-pixels and the fourth sub-pixel are arranged side by side in the second direction; in the second direction, a total length of one of the two second sub-pixel and the third sub-pixel is less than a length of the first sub-pixel, and a total length of the other one of the two the second sub-pixels and the fourth sub-pixel is less than the length of the first sub-pixel; and in the second direction, a length of one of the two second sub-pixels is smaller than a length of the third sub-pixel, and in the second direction, a length of the other one of the two second sub-pixels is smaller than a length of the fourth sub-pixel.

2. The pixel arrangement structure according to claim 1, wherein a light emitting color of one of the two second sub-pixels is identical to that of the first sub-pixel, and a light emitting color of the other one of the two second sub-pixels is white.

3. The pixel arrangement structure according to claim 1, wherein the light emitting color of the first sub-pixel is blue.

4. The pixel arrangement structure according to claim 3, wherein the second sub-pixel is a Micro LED or Mini LED.

5. The pixel arrangement structure according to claim 1, wherein the third sub-pixel comprises a second quantum dot light emitting diode, and a light emitting color of the third sub-pixel is red;

the fourth sub-pixel comprises a third quantum dot light emitting diode, and a light emitting color of the fourth sub-pixel is green.

6. A method of driving a pixel arrangement structure, wherein the method is used to drive the pixel arrangement structure according to claim 1, and comprises:

for each of pixel units, determining color coordinates of a light emitting color of the pixel unit according to image data of a to-be-displayed image;

in response to that the color coordinates are located within a first color gamut corresponding to a second sub-pixel, controlling the second sub-pixel to emit light, and prohibiting the first sub-pixel from emitting light; and in response to that the color coordinates are located outside the first color gamut and within a second color gamut corresponding to the first sub-pixel, controlling the first sub-pixel to emit light.

7. A display substrate, comprising: the pixel arrangement structure according to claim 1.

8. A pixel arrangement structure, comprising: pixel units arranged in an array, wherein each of the pixel units comprises a first sub-pixel and a second sub-pixel, the first sub-pixel comprises a first quantum dot light emitting diode, the second sub-pixel comprises an inorganic light emitting diode, a light emitting color of the second sub-pixel is identical to that of the first sub-pixel;

wherein the pixel arrangement structure further comprises two second sub-pixels;

wherein each of the pixel units further comprises a third sub-pixel and a fourth sub-pixel, wherein in each of the pixel units, the third sub-pixel, the fourth sub-pixel, and the first sub-pixel are arranged side by side in a first direction; one of the two second sub-pixels and the first sub-pixel are arranged in a second direction, and the other one of the two second sub-pixels and the first sub-pixel are arranged in the second direction; one of the two second sub-pixels and the other one of the two second sub-pixels are arranged side by side in the first direction; and a length of the fourth sub-pixel in the second direction is same as a length of the third sub-pixel in the second direction, and a length of the first sub-pixel in the second direction is smaller than a length of the third sub-pixel in the second direction.

9. The pixel arrangement structure according to claim 8, wherein a light emitting color of one of the two second sub-pixels is identical to that of the first sub-pixel, and a light emitting color of the other one of the two second sub-pixels is white.

10. The pixel arrangement structure according to claim 8, wherein the light emitting color of the first sub-pixel is blue.

11. The pixel arrangement structure according to claim 10, wherein the second sub-pixel is a Micro LED or Mini LED.

12. The pixel arrangement structure according to claim 8, wherein
   the third sub-pixel comprises a second quantum dot light emitting diode, and a light emitting color of the third sub-pixel is red;
   the fourth sub-pixel comprises a third quantum dot light emitting diode, and a light emitting color of the fourth sub-pixel is green.

13. A method of driving a pixel arrangement structure, wherein the method is used to drive the pixel arrangement structure according to claim 8, and comprises:
   for each of pixel units, determining color coordinates of a light emitting color of the pixel unit according to image data of a to-be-displayed image;
   in response to that the color coordinates are located within a first color gamut corresponding to a second sub-pixel, controlling the second sub-pixel to emit light, and prohibiting the first sub-pixel from emitting light; and
   in response to that the color coordinates are located outside the first color gamut and within a second color gamut corresponding to the first sub-pixel, controlling the first sub-pixel to emit light.

14. A display substrate, comprising: the pixel arrangement structure according to claim 8.

15. A pixel arrangement structure, comprising: pixel units arranged in an array, wherein each of the pixel units comprises a first sub-pixel and a second sub-pixel, the first sub-pixel comprises a first quantum dot light emitting diode, the second sub-pixel comprises an inorganic light emitting diode, a light emitting color of the second sub-pixel is identical to that of the first sub-pixel, or the light emitting color of the second sub-pixel is white;

wherein the pixel arrangement structure further comprises two second sub-pixels;
wherein each of the pixel units further comprises a third sub-pixel and a fourth sub-pixel,
wherein in each of the pixel units, the third sub-pixel, the fourth sub-pixel, and the first sub-pixel are arranged side by side in a first direction; one of the two second sub-pixels and the first sub-pixel are arranged in a second direction, the other one of the two second sub-pixels and the third sub-pixel are arranged in the second direction, and the other one of the two second sub-pixels and the fourth sub-pixel are arranged in the second direction; in the first direction, a length of one of the two second sub-pixels is same as a length of the first sub-pixel, and a total length of the third sub-pixel and the fourth sub-pixel is less than a length of the other one of the two second sub-pixels; and in the second direction, lengths of the third sub-pixel, the fourth sub-pixel, and the length of the first sub-pixel are same; a total length of the first sub-pixel and one of the two second sub-pixels is equal to a total length of the fourth sub-pixel and the other one of the two second sub-pixels.

16. The pixel arrangement structure according to claim 15, wherein a light emitting color of one of the two second sub-pixels is identical to that of the first sub-pixel, and a light emitting color of the other one of the two second sub-pixels is white.

17. The pixel arrangement structure according to claim 15, wherein the light emitting color of the first sub-pixel is blue.

18. The pixel arrangement structure according to claim 17, wherein the second sub-pixel is a Micro LED or Mini LED.

19. The pixel arrangement structure according to claim 15, wherein
   the third sub-pixel comprises a second quantum dot light emitting diode, and a light emitting color of the third sub-pixel is red;
   the fourth sub-pixel comprises a third quantum dot light emitting diode, and a light emitting color of the fourth sub-pixel is green.

20. A method of driving a pixel arrangement structure, wherein the method is used to drive the pixel arrangement structure according to claim 15, and comprises:
   for each of pixel units, determining color coordinates of a light emitting color of the pixel unit according to image data of a to-be-displayed image;
   in response to that the color coordinates are located within a first color gamut corresponding to a second sub-pixel, controlling the second sub-pixel to emit light, and prohibiting the first sub-pixel from emitting light; and
   in response to that the color coordinates are located outside the first color gamut and within a second color gamut corresponding to the first sub-pixel, controlling the first sub-pixel to emit light.

\* \* \* \* \*